United States Patent
Jin

(10) Patent No.: US 11,804,869 B2
(45) Date of Patent: *Oct. 31, 2023

(54) RADIO FREQUENCY SWITCH

(71) Applicant: Taiwan Semiconductor Manufacturing Co., Ltd., Hsin-Chu (TW)

(72) Inventor: Jun-De Jin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/461,621

(22) Filed: Aug. 30, 2021

(65) Prior Publication Data

US 2021/0391891 A1    Dec. 16, 2021

Related U.S. Application Data

(63) Continuation of application No. 16/668,707, filed on Oct. 30, 2019, now Pat. No. 11,128,339.

(51) Int. Cl.
*H04B 1/48* (2006.01)
*H01Q 1/50* (2006.01)
(Continued)

(52) U.S. Cl.
CPC ............... *H04B 1/48* (2013.01); *H01L 23/66* (2013.01); *H01L 29/513* (2013.01); *H01L 29/516* (2013.01); *H01L 29/6684* (2013.01); *H01L 29/7851* (2013.01); *H01L 29/78391* (2014.09); *H01Q 1/50* (2013.01)

(58) Field of Classification Search
CPC ......... H04B 1/48; H01L 23/66; H01L 29/513; H01L 29/516; H01L 29/6684; H01L 29/78391; H01L 29/7851; H01L 29/785; H01L 29/51; H01Q 1/50; H03K 17/687
See application file for complete search history.

(56) References Cited

U.S. PATENT DOCUMENTS

2011/0068399 A1*  3/2011  Bryant ............... H01L 27/1211
                                                    257/E29.264
2011/0316062 A1   12/2011  Kondo
(Continued)

*Primary Examiner* — Yuwen Pan
*Assistant Examiner* — Fatuma G Sherif
(74) *Attorney, Agent, or Firm* — Duane Morris LLP

(57) ABSTRACT

Disclosed is a RF switch module and methods to fabricate and operate such RF switch to alternatively couple an antenna to either a transmitter transmission line or a receiver transmission line to realize lower distortion of a signal at high frequencies with improved insertion loss and without affecting isolation. In one embodiment, a Radio Frequency (RF) switch module, includes, a switch circuit for switching between transmitting first signals from a transmitter unit to an antenna and transmitting second signals from the antenna to the receiver unit, wherein the switch circuit comprises a plurality of field effect transistors (FETs), wherein each of the plurality of FETs comprises stacked gate dielectrics and at least three metal contacts to a conductive gate, wherein the stacked gate dielectrics comprises at least one first dielectric layer, wherein the first dielectric layer comprises a negative-capacitance material.

20 Claims, 17 Drawing Sheets

(51) Int. Cl.
*H01L 23/66* (2006.01)
*H01L 29/66* (2006.01)
*H01L 29/51* (2006.01)
*H01L 29/78* (2006.01)

(56) References Cited

U.S. PATENT DOCUMENTS

| | | | |
|---|---|---|---|
| 2014/0062577 A1* | 3/2014 | Chih-Sheng | ......... H03K 17/693 |
| | | | 327/427 |
| 2017/0365719 A1 | 12/2017 | Chen | |
| 2018/0233466 A1 | 8/2018 | Yen | |
| 2020/0058581 A1* | 2/2020 | El-Hinnawy | ...... H10N 70/8828 |

\* cited by examiner

RADIO FREQUENCY SWITCH

RELATED APPLICATION

This application is a continuation of U.S. patent application Ser. No. 16/668,707, filed Oct. 30, 2019, the contents of which are incorporated herein.

BACKGROUND

In recent years, the spread of mobile phones and mobile phone applications has been remarkable. Usually, in portable terminals such as mobile phones, radio frequency (RF) switching devices are provided to alternatively couple an antenna to either a transmitter amplifier or a receiver amplifier in order to switch between transmitting and receiving of a signal. There exists a demand to develop an RF switch to alternatively couple an antenna to either a transmitter or a receiver to realize lower distortion of a signal at high frequencies with improved insertion loss and without affecting isolation.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

Radio Frequency (RF) switching devices are provided to alternatively couple an antenna to either a transmitter amplifier or a receiver amplifier to switching between transmitting and receiving of a signal. This disclosure presents various embodiments of a RF switch module and methods to fabricate and operate such RF switch to alternatively couple an antenna to either a transmitter transmission line or a receiver transmission line to realize lower distortion of a signal at high frequencies with improved insertion loss and without affecting isolation.

Figure 1:
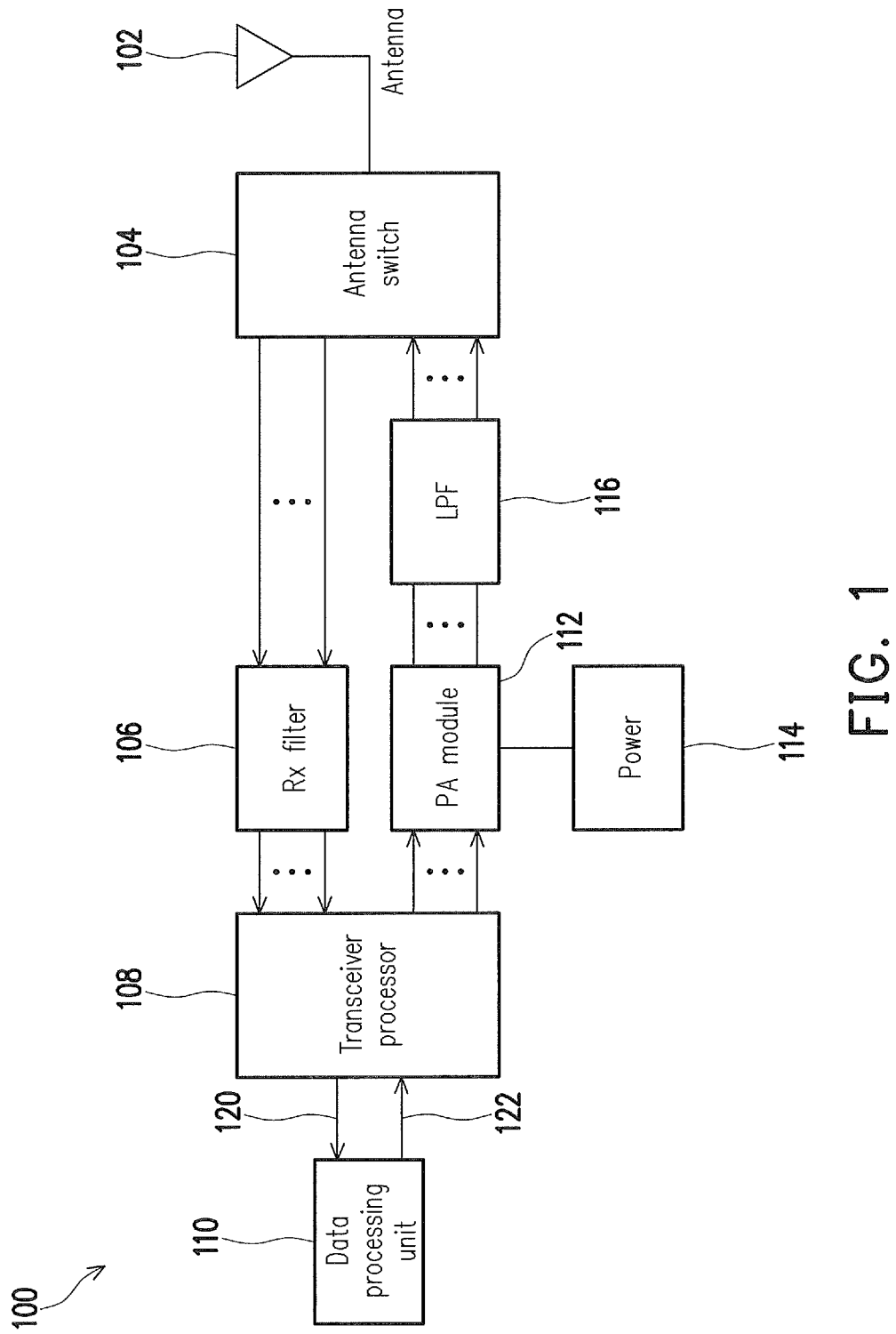
FIG. 1 illustrates an exemplary block diagram of a Radio Frequency (RF) transceiver system, in accordance with some embodiments of the present disclosure.

FIG. 1 illustrates an exemplary block diagram of a Radio Frequency (RF) transceiver system 100, in accordance with some embodiments of the present disclosure. In the illustrated embodiment, the RF transceiver system 100 comprises at least one antenna 102, an RF switch 104, a receiver (Rx) filter 106, a transceiver unit 108, a data processing unit 110, a power amplifier (PA) module 112, a power supply 114, and a low-pass filter (LPF) 116. Accordingly, it is understood that additional functional blocks may be provided within the RF transceiver system 100 for signal process, and that some other functional blocks may only be briefly described herein.

In some embodiments, the RF switch 104 is used to direct the signal from the antenna 102 to the receiver filter 106 or from the LPF 116 output to the antenna 102. The RF switch must have low loss (<0.1 dB) so as to not to add to the system noise or attenuate the transmit signal.

In some embodiments, the Rx filter 106 is to filter signals to eliminate out-of-band signals so that they will not be amplified or impact the linearity of the transceiver processor 108. In some embodiments, the transceiver processor 108 further comprises at least one of the following signal processing elements, including a low noise amplifier, an RF filter, a mixer, a demodulator, a digital-to-analog converter, an analog-to-digital converter, and a modulator. Received data 120 is further transmitted to a data processing unit. In some embodiments, transmit data 122 from the data processing unit 110 is processed by the transceiver processor 108, is amplified by the PA module 112 and filtered by the LPF 116 before transmitted to the RF switch 104 and further to the antenna 102.

In the illustrated embodiment, the RF switch 104 shares one antenna in transmission and reception and is configured and controlled to switch the signal path. In some embodiments, the RF switch 104 has the following characteristics such as low loss, low power consumption.

Figure 2A:
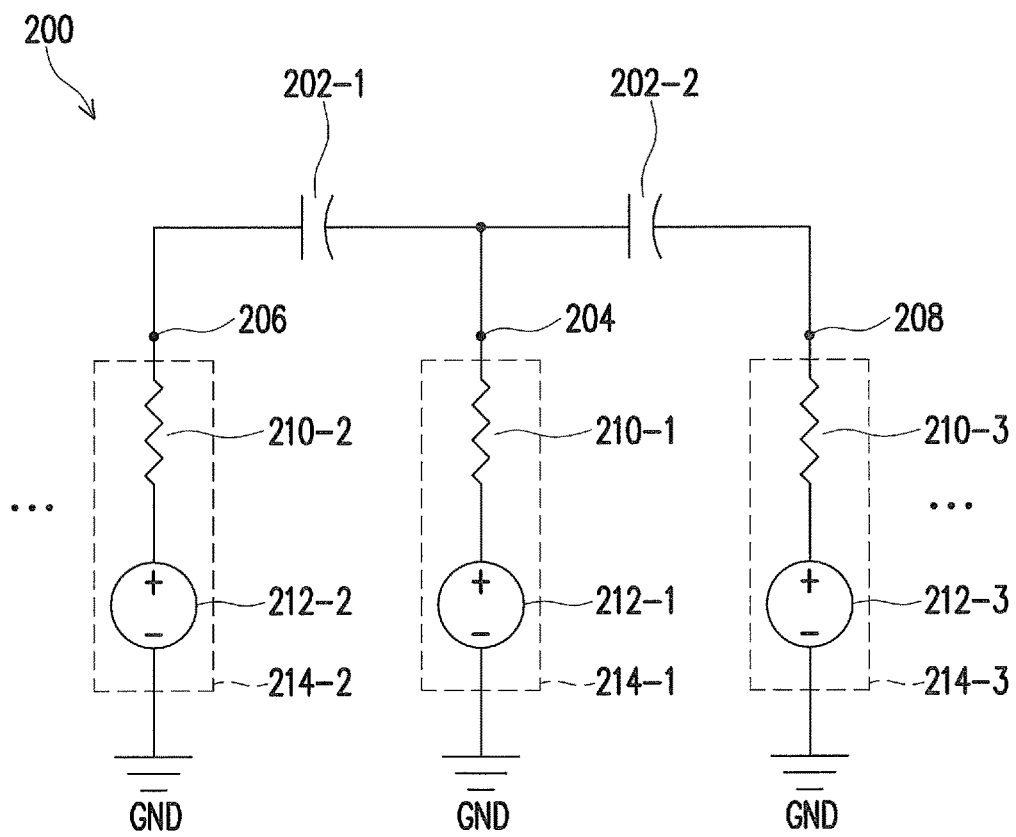
FIG. 2A illustrates a circuit diagram of an RF switch module in a Radio Frequency (RF) transceiver system, in accordance with some embodiments of the present disclosure.

FIG. 2A illustrates a circuit diagram of an RF switch module 200 in a Radio Frequency (RF) transceiver system 100, in accordance with some embodiments of the present disclosure. In the illustrated embodiments, the RF switch 200 comprises 3 ports, including an antenna port 204, a transmitter port 206, and a receiver port 208. It should be noted that an RF switch 200 can comprise any numbers of transmitter ports or receiver ports, which are within the scope of this invention.

In the illustrated embodiment, the transmitter port 206 is coupled to the antenna port 204 through a first capacitance switch 202-1; and the receiver port 208 is also coupled to the antenna port 204 through a second capacitance switch 202-2. Each of the first capacitance switch 202-1 and the second capacitance switch 202-2 is a varactor diode, wherein the varactor diode exhibits a voltage-dependent capacitance. As discussed in detail below, the varactor diode used in the capacitance switch 202 is constructed based on a Complementary Metal-Oxide Semiconductor (CMOS) Field Effect Transistor (FET) with inhomogeneous layered dielectrics as the gate stack. In some embodiments, each of the capacitance switch 202 comprises at least 2 layers of dielectrics, wherein the at least two layers of dielectrics comprises at least one layer of high-k dielectric material and at least one layer of a negative-capacitance material. The stacked dielectric in the capacitance switch 202 provide an overall capacitance (Ceq) equivalent to at least two capacitances connected in series, including a first capacitance C1 from the high-k dielectric and a second capacitance C2 from the negative-capacitance dielectric. Using 1 layer of a high-k dielectric material and 1 layer of a negative-capacitance material as an example, the overall capacitance Ceq is determined by the following equation: $Ceq=(C1^{-1}+C2^{-1})^{-1}=C1C2/(C1+C2)$.

In the illustrated embodiment, each of the three ports, i.e., the antenna port 204, the transmitter port 206, and the receiver port 208 is coupled to a power supply unit 214. Specifically, the antenna port 204 is coupled to a first power supply unit 214-1; the transmitter port 206 is coupled to a second power supply unit 214-2; and the receiver port 208 is coupled to a third power supply unit 214-3. Each of the power supply units 214 comprises a DC power supply 212 and at least one resistor 210. In some embodiments, the DC power supply 212 and the at least one resistor 210 are coupled in series between each of the corresponding ports and ground (GND).

In the illustrated embodiment, when the DC voltage provided from the DC power supply 212-2 is low or no bias, a large capacitance value and thus a low RF impedance from the varactor 202-1 can be achieved in the signal line on the transmitter port 206, allowing the RF signal from the transmitter to be transmitted to the antenna port 204. Meanwhile, when the DC voltage (VDD) provided from the DC power supply 212-3 is large, a small capacitance value and thus a large RF impedance from the varactor 202-2 can be achieved in the signal line on the receiver port 208, blocking the RF signal from entering the receiver port 208. In this case, the capacitance switch 202-1 is on and the capacitance switch 202-2 is off, so that the RF switch 200 is in a transmitter mode. In some embodiments, a DC voltage across the gate and one of the source or drain terminals of the FET in a range of ±1~±2 Volt is applied to turn on the capacitance switch 202.

Similarly, when the DC voltage provided from the DC power supply 212-3 is low or no bias, a large capacitance value and thus a low RF impedance from the varactor 202-2 can be achieved in the signal line on the receiver port 208, allowing the RF signal received on the antenna port 204 entering the receiver port 208. Meanwhile, when the DC voltage (VDD) provided from the DC power supply 212-2 is large, a small capacitance value and thus a large RF impedance from the varactor 202-1 can be achieved in the signal line on the transmitter port 206, blocking the RF signal from the transmitter to be transmitted to the antenna port 204. In this case, the capacitance switch 202-2 is on and the capacitance switch 202-1 is off, so that the RF switch 200 is in a receiver mode. In some embodiments, a DC voltage across the gate and one of the source or drain terminals of the FET in a range of ±1~±2 Volt can be used to turn on the capacitance switch 202.

Figure 2B:
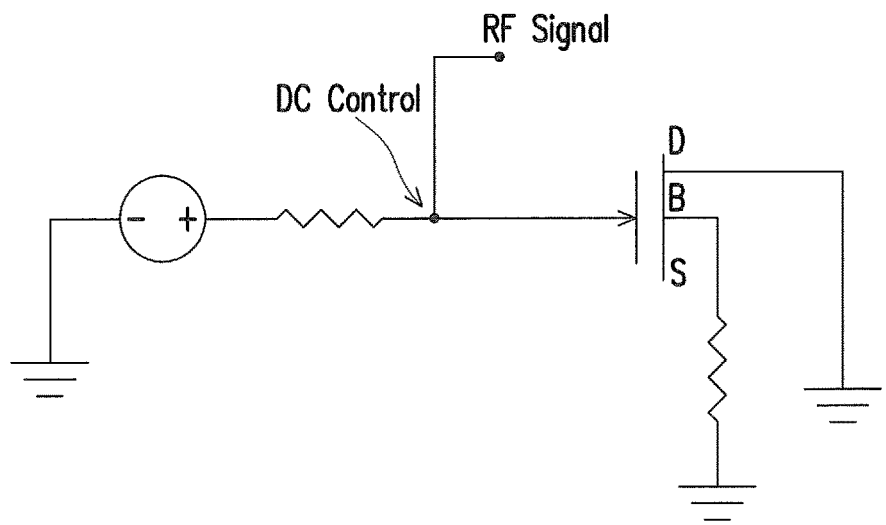
FIG. 2B illustrates a circuit diagram of an RF switch utilizing a DC voltage for switching on or off a capacitance switch, in accordance with some embodiments of the present disclosure.

As shown in FIG. 2B, in some embodiments, a DC voltage for switching on or off the capacitance switch 202 is applied on the gate terminal, while the drain terminal is grounded, the body terminal is grounded through a large resistor (e.g., with a resistance value of 100 kOhm) and the source terminal remains open. In some other embodiments, a DC voltage for switching on or off the capacitance switch 202 is applied on the gate terminal, while the source terminal is grounded, the body terminal is ground through a large resistor (e.g., with a resistance value of 100 kOhm), and the drain terminal remains open.

Figure 3A:
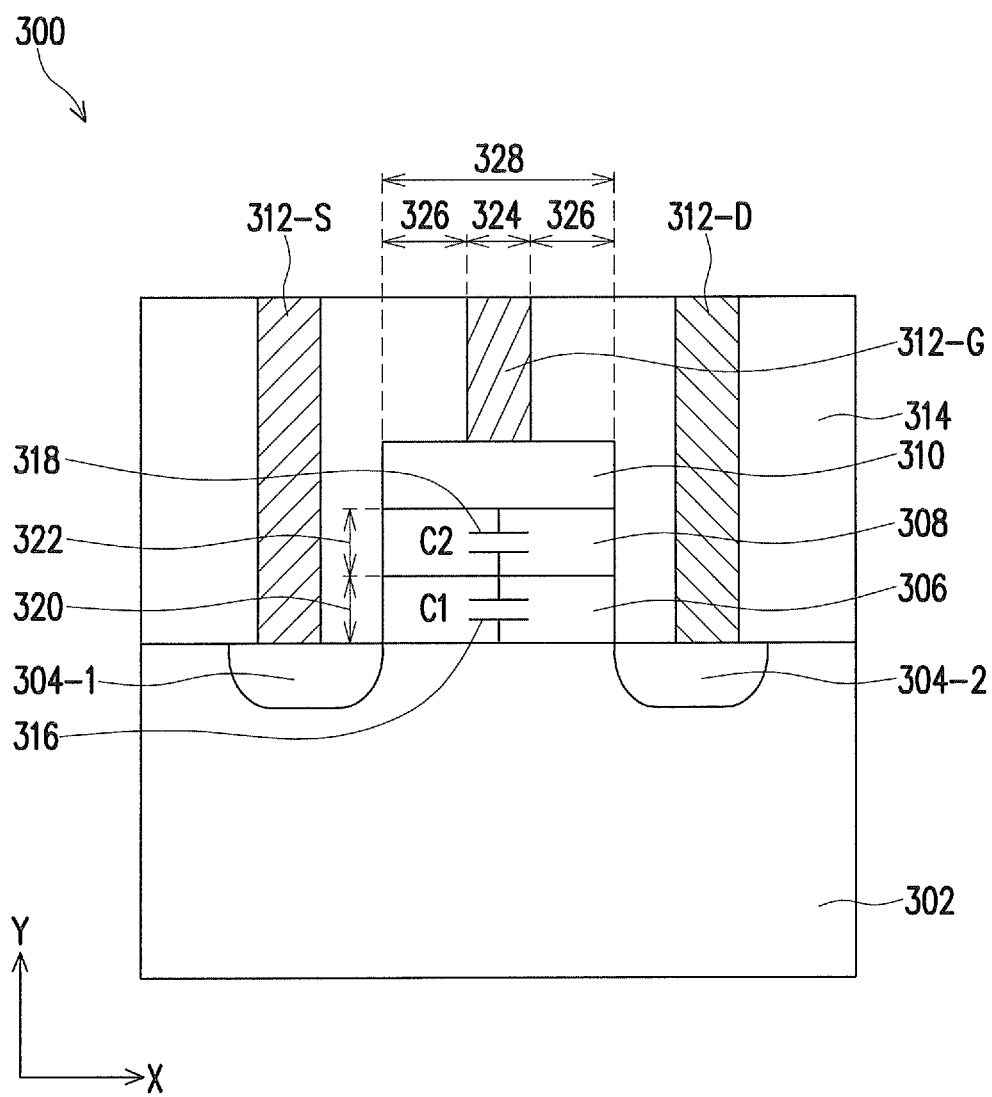
FIGS. 3A-3B illustrate exemplary cross-sectional view and top view of an Radio Frequency (RF) switch based on a negative-capacitance field effect transistor (FET), in accordance with some embodiments of the present disclosure.
Figure 3B:
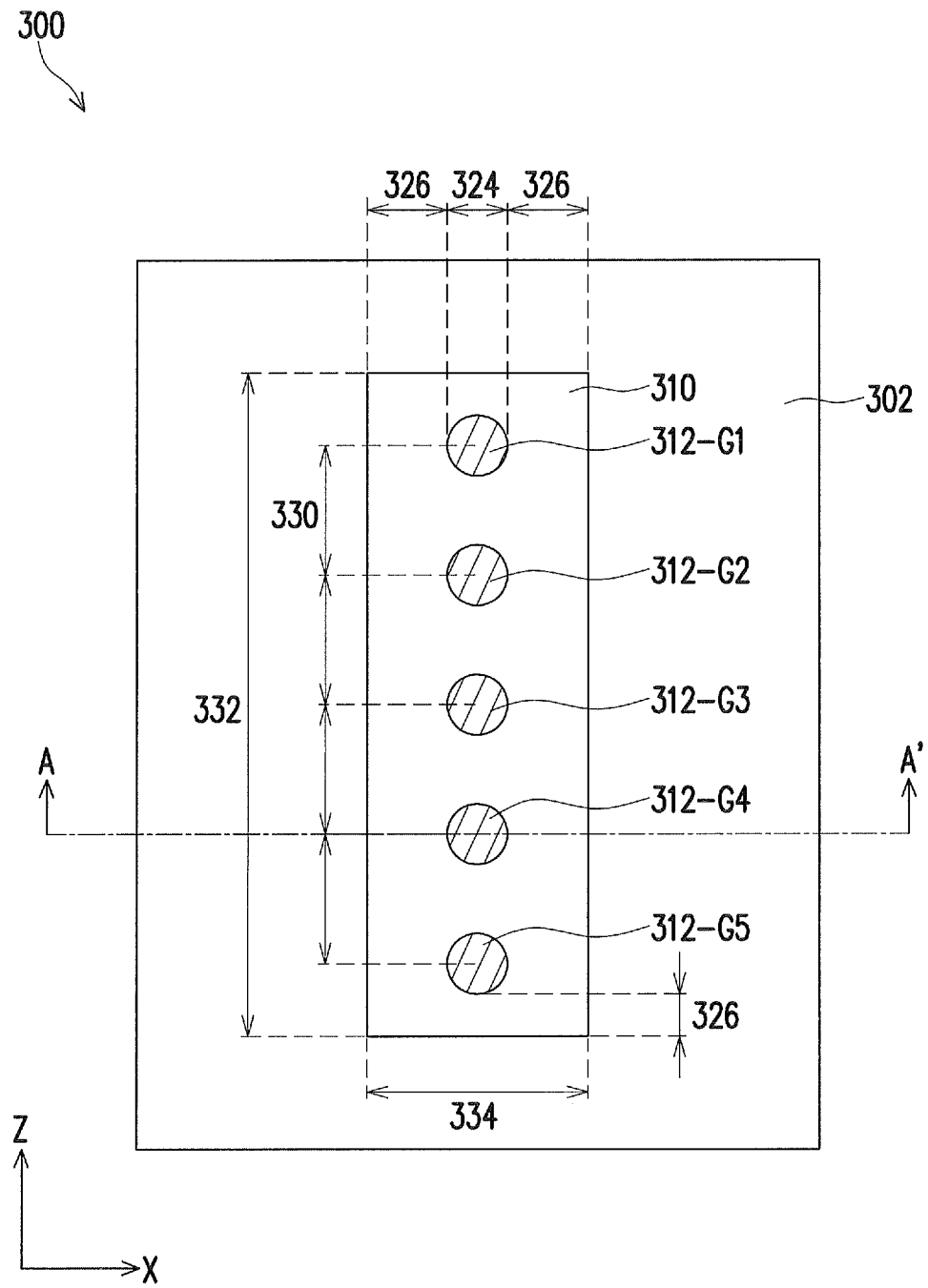

FIGS. 3A-3B illustrate exemplary cross-sectional view and top view of a negative-capacitance field effect transistor (FET) 300 for a capacitance switch in an RF switch 200, in accordance with some embodiments of the present disclosure. In some embodiments, the negative-capacitance FET 300 comprises two highly-doped conductive regions 304-1 and 304-2 as the source and drain terminals, a conductive gate 310, a stacked gate dielectrics 308/306, and metallic contacts 312-S, 312-D and 312-G. The negative-capacitance FET 300 is fabricated on a semiconductor substrate 302 and embedded in a dielectric layer 314.

In the illustrated embodiment, the stacked gate dielectrics is inhomogeneous in the y direction comprising 2 stacked dielectric materials, i.e., a first dielectric layer 306 and a second dielectric layer 308. The inhomogeneous capacitor with two dielectrics between the gate terminal and the source terminal can be modelled as two capacitors in series, i.e., a first capacitor C1 316 in the first dielectric layer 306 and a second capacitor C2 318 in the second dielectric layer 308. The overall capacitance Ceq is determined by the following equation: $Ceq=(C1^{-1}+C2^{-1})^{-1}=C1C2/(C1+C2)$.

In some embodiments, the first dielectric layer 306 comprises a conventional dielectric material with high dielectric constant (i.e., a high-k dielectric material) for improved reliability and high capacitance values. In some embodiments, the first dielectric layer 306 comprises one of the following materials, including hafnium silicate (HfSiO4), zirconium silicate (ZrSiO4), hafnium dioxide (HfO2), zirconium dioxide (ZrO2), silicon oxynitride (Si2ON2), and nitride hafnium silicates (HfSiON).

In some embodiments, a first thickness 320 of the first dielectric layer 306 is in a range of 0.1-200 nanometers. In some embodiments, the first dielectric layer 306 is deposited using plasma enhanced chemical vapor deposition (PECVD) with a silane gas as a precursor gas. In some other embodiments, the first dielectric layer 306 is deposited using one of the following: an atomic layer deposition (ALD) process, and a physical vapor deposition (PVD) process.

In some embodiments, the second dielectric layer 308 is formed on the top surface of the first dielectric layer 306, wherein the second dielectric layer 308 exhibit a negative capacitance (i.e., C2<0) in a certain range of an applied bias. In some embodiments, the second dielectric layer 308 comprises HfO2 doped with various elements including Y, Sr, Gd, Zr, Al, Lu, Ta, Nb, and Si, wherein the doped HfO2 dielectric in the second dielectric layer 308 exhibits ferroelectric properties. In some embodiments, the doped HfO2 dielectric in the second dielectric layer 308 is ascribed to the metastable, non-centrosymmetric, orthorhombic phase being stabilized by the dopants. In some embodiments, the doped HfO2 dielectric in the second dielectric layer 308 can be easily integrated with the CMOS process. In some other embodiments, the second dielectric layer 308 further comprises ZrO2 doped with Ta and Ti. In some further embodiments, the second dielectric layer 308 comprises a ferroelectric material, including BaTiO3, SrRuO3, and PbZr1-xTixO3.

In some embodiments, a second thickness 322 of the second dielectric layer 308 is in a range of 0.1-200 nanometers. In the illustrated embodiments, the second dielectric layer 308 has a length of 332 in the z direction and a width of 334 in the x direction, which has the same area as the conductive gate 310. In some embodiments, a ratio between the area of a top surface of the second dielectric layer 308 and the area of the transistor channel is in a range of 0.1-5. In some embodiments, the second dielectric layer 308 is deposited using plasma enhanced chemical vapor deposition (PECVD) with a silane gas as a precursor gas. In some other embodiments, the second dielectric layer 308 is deposited using one of the following: an atomic layer deposition (ALD) process, and a physical vapor deposition (PVD) process. In some embodiments, the second dielectric layer 308 is deposited at a temperature in a range of 0-1000 degree Celsius. In some embodiments, after deposition of the second dielectric layer 308 and before forming the conductive gate 310, the second dielectric layer 308 is annealed through a rapid thermal annealing (RTA) process at a temperature in a range of 100-1000 degree Celsius for a time period in a range of 1-600 second.

Although in the exemplary embodiment, the second dielectric layer 308 is configured above the first dielectric layer 306, wherein the first dielectric layer 306 is in direct contact with the substrate 302, the second dielectric layer 308 can be configured between the first dielectric layer 306 and the substrate 302, which is also within the scope of this invention. Although only 2 dielectric layers in the stacked gate dielectrics are shown, the exemplary embodiment is for discussion purposes. It should be noted that the stacked gate dielectrics can comprise any numbers of alternating dielectric layers, e.g., negative-capacitance dielectric layer—conventional dielectric layer superlattices, which are within the scope of the invention.

In some embodiments, the substrate 302 is a silicon substrate. Alternatively, the substrate 302 may include other elementary semiconductor material such as, for example, germanium. The substrate 302 may also include a compound semiconductor such as silicon carbide, gallium arsenic, indium arsenide, and indium phosphide. The substrate 302 may include an alloy semiconductor such as silicon germanium, silicon germanium carbide, gallium arsenic phosphide, and gallium indium phosphide. In one embodiment, the substrate 302 includes an epitaxial layer. For example, the substrate 302 may have an epitaxial layer overlying a bulk semiconductor. Furthermore, the substrate 302 may include a semiconductor-on-insulator (SOI) structure. For example, the substrate 302 may include a buried oxide (BOX) layer formed by a process such as separation by implanted oxygen (SIMOX) or other suitable technique, such as wafer bonding and grinding.

In some embodiments, the substrate 302 also includes various p-type doped regions and/or n-type doped regions, implemented by a process such as ion implantation and/or diffusion. Those doped regions include n-well, p-well, lightly doped region (LDD), heavily doped source and drain (S/D) terminals 304-1/304-2, and various channel doping profiles configured to form various integrated circuit (IC) devices, such as a CMOS field-effect transistor (CMOSFET), imaging sensor, and/or light emitting diode (LED). The substrate 302 may further include other functional features such as a resistor or a capacitor formed in and on the substrate. The substrate 302 further includes lateral isolation features provided to separate various devices formed in the substrate 302, for example shallow trench isolation (STI). The various devices in the substrate 302 further include silicide disposed on S/D terminals, gate terminal and other device features for reduced contact resistance and enhance process compatibility when coupled between devices through metal contacts 312-S/312-D/312-G.

In some embodiment, at least one conductive feature is included in the substrate 302. In some embodiments, the at least one conductive feature can be a source 304-1, drain 304-2, or gate terminals 310. Alternatively, the at least one conductive feature may be a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or on source/drain (typically known as "salicide") by a self-aligned silicide technique. In another embodiment, the at least one conductive feature may include an electrode of a capacitor or one end of a resistor. In the illustrated embodiment, at least three metal contacts 312-G are configured to make electrical contact to the conductive gate 310. In some embodiments, each of the at least three metal contacts has a width 324 and an enclosure distance 326, wherein the enclosure distance 326 is defined as a distance between the edge of the metal contacts 312-G to the edge of the conductive gate 310. The at least three metal contacts 312-G are configured in a row with a spacing 330 between two of the neighboring metal contacts. In some embodiments, a first ratio between the spacing 330 and the first thickness 320 of the first dielectric layer 306 is in a range of 0.01-100; a second ratio between the spacing 330 and the second thickness 322 of the second dielectric layer 308 is in a range of 0.1-10000; a third ratio between the spacing 330 and the channel width 334 is in a range of 0.1-10000; a fourth ratio between the spacing 330 and the channel length 332 is in a range of 0.00001-1; a fifth ratio of the enclosure distance 326 and the second thickness 322 of the second dielectric layer 308 is in a range of 0.1-10000; a sixth ratio of the enclosure distance 326 and the channel width 334 is in a range of 0.1-10000; and a seventh ratio of the enclosure distance 326 and the channel length 332 is in a range of 0.1-10000. In some embodiments, the at least three metal contacts can be arranged in an array configured in at least two rows and at least two columns.

Figure 4:
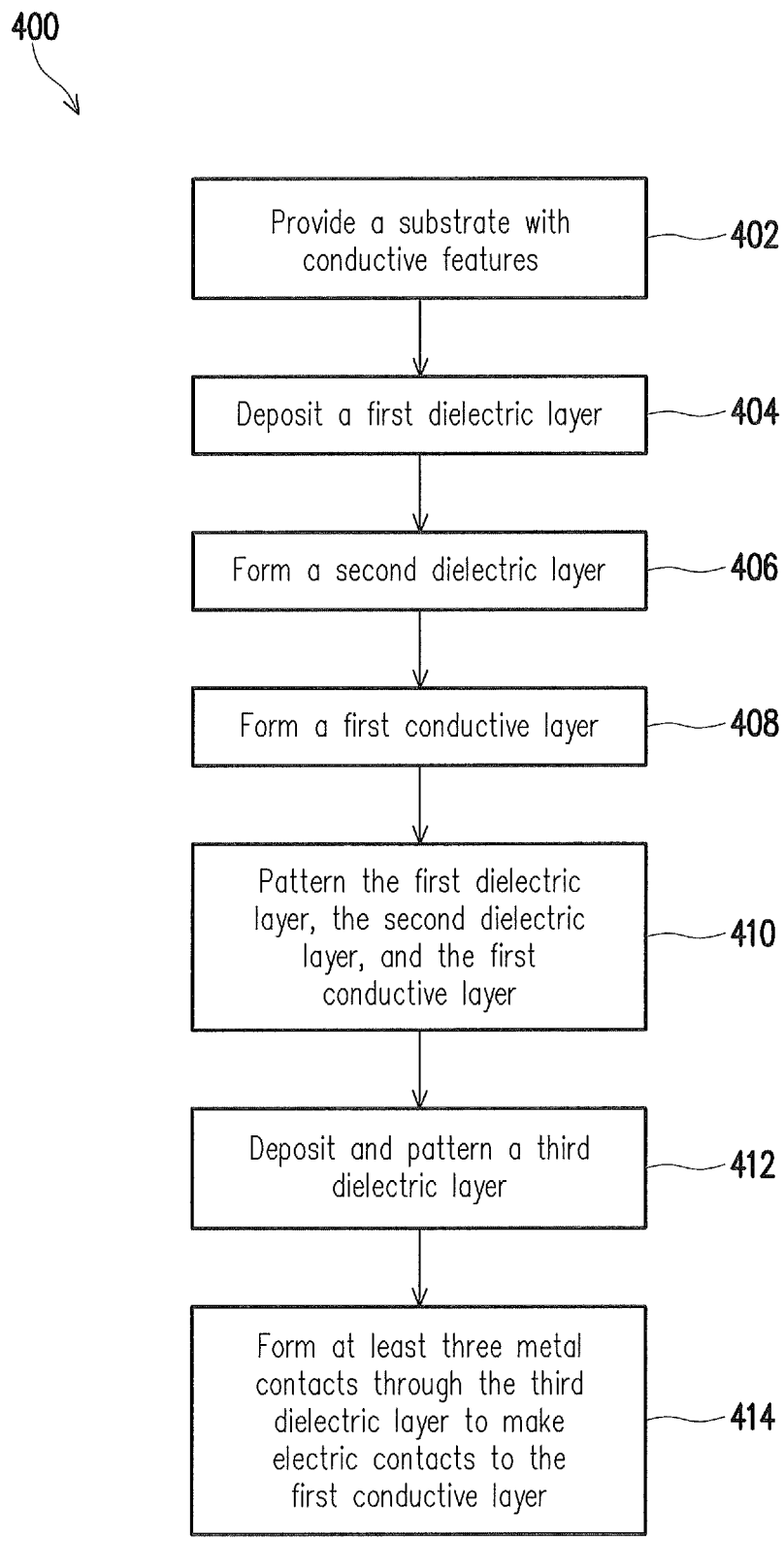
FIG. 4 illustrates a flow chart of an exemplary method for forming a semiconductor device, in accordance with some embodiments of the present disclosure.

FIG. 4 illustrates a flow chart of a method 400 to form a semiconductor device, in accordance with some embodiments of the present disclosure. It is noted that the method 400 is merely an example, and is not intended to limit the present disclosure. Accordingly, it is understood that additional operations may be provided before, during, and after the method 400 of FIG. 4, and that some other operations may only be briefly described herein. In some embodiments, operations of the method 400 may be associated with cross-sectional views of a semiconductor device at various fabrication stages as shown in FIGS. 5A-5J, respectively, which will be discussed in further detail below.

Referring now to FIG. 4, the method 400 starts with operation 402 in which a substrate is provided according to some embodiments. In some embodiments, the substrate comprises conductive features. The method 400 continues with operation 404 in which a first dielectric layer is deposited on the surface of the substrate according to some embodiments. In some embodiments, the first dielectric layer comprises a high-k dielectric material. The method 400 continues with operation 406 in which a second dielectric layer is deposited on the surface of the first dielectric layer according to some embodiments. In some embodiments, the second dielectric layer comprises a negative-capacitance dielectric material, which exhibits a negative capacitance in a certain range of an applied bias. The method 400 continues with operation 408 in which a first conductive layer is deposited on the surface of the second dielectric layer according to some embodiments. In some embodiments, the first conductive layer comprises polycrystalline silicon (polySi). The method 400 continues with operation 410 in which the first dielectric layer, the second dielectric layer and the first conductive layer are patterned according to some embodiments. In some embodiments, the patterned first dielectric layer and the second dielectric layer are sandwiched between the patterned first conductive layer to form a stacked gate dielectric. The method 400 continues with operation 412 in which a third dielectric layer is deposited according to some embodiments. In some embodiments, the third dielectric layer is first deposited to embed the patterned first dielectric layer, the patterned second dielectric layer, the first conductive layer and exposed surfaces of the substrate. The method 400 continues with operation 414 in which at least three metal contacts are formed to make electric contacts to the first conductive layer according to some embodiments. In some embodiments, prior to forming the metal contacts, the third dielectric layer is further polished to form a planar surface. In some embodiments, metal contacts to the conductive features in the substrate can be also formed.

As mentioned above, FIGS. 5A-5I illustrate, in a cross-sectional view, a portion of a semiconductor device 500 at various fabrication stages of the method 400 of FIG. 4. The semiconductor device 500 may be included in an integrated circuit (IC). Also, FIGS. 5A-5I are simplified for a better understanding of the concepts of the present disclosure. Although the figures illustrate the semiconductor device 500, it is understood the IC may comprise a number of other devices such as resistors, capacitors, inductors, fuses, etc., which are not shown in FIGS. 5A-5I, for purposes of clarity of illustration.

Figure 5A:
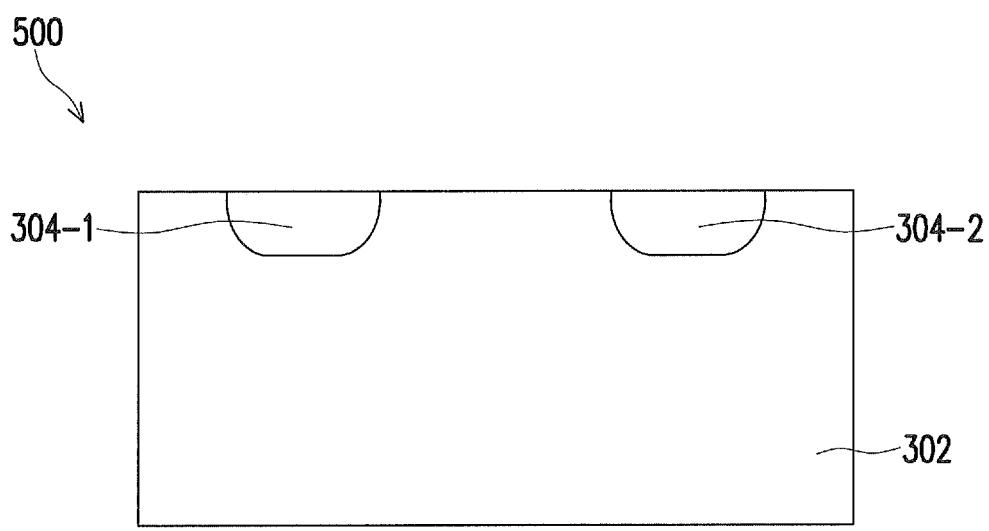
FIGS. 5A-5I illustrate cross-sectional views of an exemplary semiconductor device for RF switch during various fabrication stages, made by the method of FIG. 4, in accordance with some embodiments of the present disclosure.

FIG. 5A is a cross-sectional view of the semiconductor device 500 including a substrate 302 at one of the various stages of fabrication corresponding to operations 402 of FIG. 4, in accordance with some embodiments of the present disclosure. In some embodiments, the substrate 302 is a silicon substrate. Alternatively, the substrate 302 may include other elementary semiconductor material such as, for example, germanium. The substrate 302 may also include a compound semiconductor such as silicon carbide, gallium arsenic, indium arsenide, and indium phosphide. The substrate 302 may include an alloy semiconductor such as silicon germanium, silicon germanium carbide, gallium arsenic phosphide, and gallium indium phosphide. In one embodiment, the substrate 302 includes an epitaxial layer. For example, the substrate 302 may have an epitaxial layer overlying a bulk semiconductor. Furthermore, the substrate 302 may include a semiconductor-on-insulator (SOI) structure. For example, the substrate 302 may include a buried oxide (BOX) layer formed by a process such as separation by implanted oxygen (SIMOX) or other suitable technique, such as wafer bonding and grinding.

In some embodiments, the substrate 302 also includes various p-type doped regions and/or n-type doped regions, implemented by a process such as ion implantation and/or diffusion. Those doped regions include n-well, p-well, lightly doped region (LDD), heavily doped source and drain (S/D) terminals 304-1/304-2, and various channel doping profiles configured to form various integrated circuit (IC) devices, such as a CMOS field-effect transistor (CMOS-FET), imaging sensor, and/or light emitting diode (LED). The substrate 302 may further include other functional features such as a resistor or a capacitor formed in and on the substrate. The substrate 302 further includes lateral isolation features provided to separate various devices formed in the substrate 302, for example shallow trench isolation (STI). The various devices in the substrate 302 further include silicide disposed on S/D terminals, gate terminal and other device features for reduced contact resistance and enhance process compatibility when coupled between devices through metal contacts 312-S/312-D/312-G.

In some embodiment, at least one conductive feature is included in the substrate 302. In some embodiments, the at least one conductive feature can be a source 304-1, drain 304-2, or gate terminals 310. Alternatively, the at least one conductive feature may be a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or on source/drain (typically known as "salicide") by a self-aligned silicide technique. In another embodiment, the at least one conductive feature may include an electrode of a capacitor or one end of a resistor.

Figure 5B:
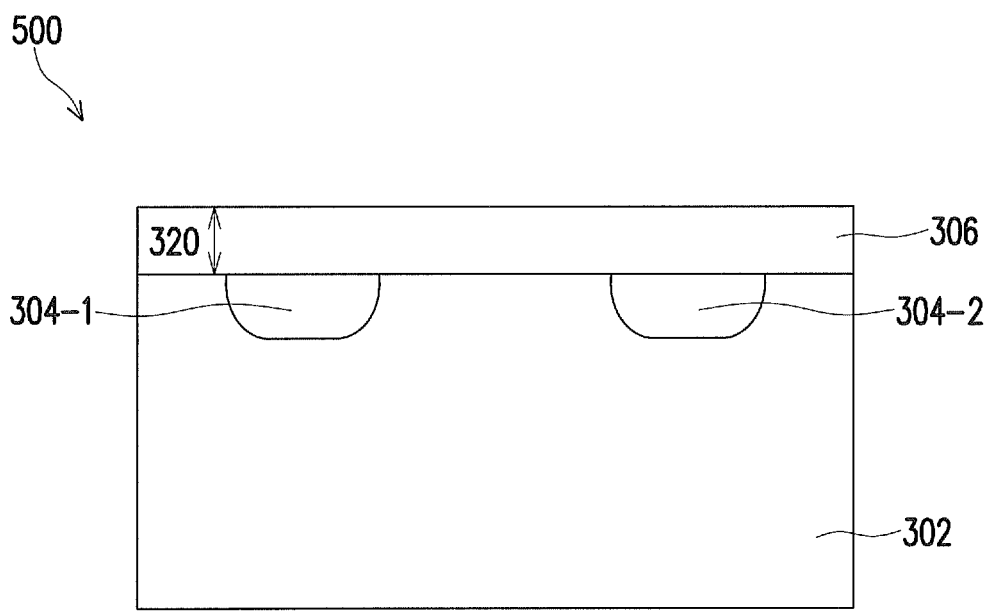

FIG. 5B is a cross-sectional view of the semiconductor device 500 including the first substrate 302 and a first dielectric layer 306 at one of the various stages of fabrication that corresponds to operation 404 of FIG. 4, in accordance with some embodiments of the present disclosure. In some embodiments, the first dielectric layer 306 comprises a conventional dielectric material with high dielectric constant (i.e., a high-k dielectric material) for improved reliability and high capacitance values. In some embodiments, the first dielectric layer 306 comprises one of the following materials, including hafnium silicate (HfSiO4), zirconium silicate (ZrSiO4), hafnium dioxide (HfO2), zirconium dioxide (ZrO2), silicon oxynitride (Si2ON2), and nitride hafnium silicates (HfSiON).

In some embodiments, a first thickness 320 of the first dielectric layer 306 is in a range of 0.1-200 nanometers. In some embodiments, the first dielectric layer 306 is deposited using plasma enhanced chemical vapor deposition (PECVD) with a silane gas as a precursor gas. In some other embodiments, the first dielectric layer 306 is deposited using one of the following: an atomic layer deposition (ALD) process, and a physical vapor deposition (PVD) process.

Figure 5C:
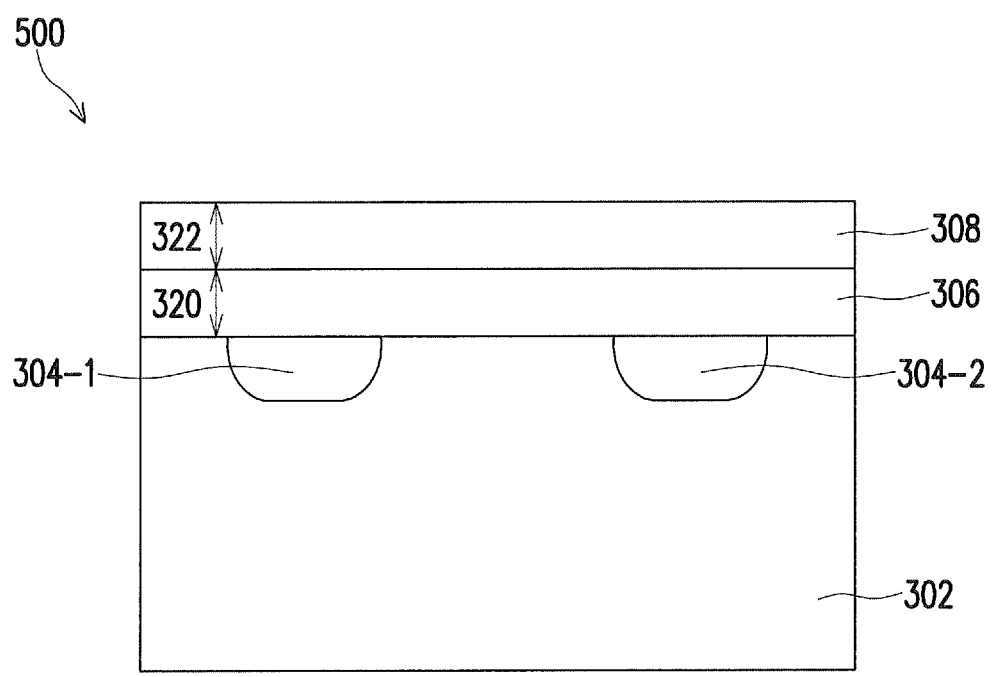

FIG. 5C is a cross-sectional view of the semiconductor device 500 including a second dielectric layer 308 over the surface of the first dielectric layer 306 at one of the various stages of fabrication that corresponds to operations 406 of FIG. 4, in accordance with some embodiments of the present disclosure. In some embodiments, the second dielectric layer 308 is formed on the top surface of the first dielectric layer 306, wherein the second dielectric layer 308 exhibit a negative capacitance (i.e., C2<0) in a certain range of an applied bias. In some embodiments, the second dielectric layer 308 comprises HfO2 doped with various elements including Y, Sr, Gd, Zr, Al, Lu, Ta, Nb, and Si, wherein the doped HfO2 dielectric in the second dielectric layer 308 exhibits ferroelectric properties. In some embodiments, the doped HfO2 dielectric in the second dielectric layer 308 is ascribed to the metastable, non-centrosymmetric, orthorhombic phase being stabilized by the dopants. In some embodiments, the doped HfO2 dielectric in the second dielectric layer 308 can be easily integrated with the CMOS process. In some other embodiments, the second dielectric layer 308 further comprises ZrO2 doped with Ta and Ti. In some further embodiments, the second dielectric layer 308 comprises a ferroelectric material, including BaTiO3, SrRuO3, and PbZr1-xTixO3.

In some embodiments, a second thickness 322 of the second dielectric layer 308 is in a range of 0.1-200 nanometers. In the illustrated embodiments, the second dielectric layer 308 has a length of 332 in the z direction and a width of 334 in the x direction, which has the same area as the conductive gate 310. In some embodiments, a ratio between the area of a top surface of the second dielectric layer 308 and the transistor channel is in a range of 0.1-5. In some embodiments, the second dielectric layer 308 is deposited using plasma enhanced chemical vapor deposition (PECVD) with a silane gas as a precursor gas. In some other embodiments, the second dielectric layer 308 is deposited using one of the following: an atomic layer deposition (ALD) process, and a physical vapor deposition (PVD) process. In some embodiments, the second dielectric layer 308 is deposited at a temperature in a range of 0-1000 degree Celsius. In some embodiments, after deposition of the second dielectric layer 308 and before forming the conductive gate 310, the second dielectric layer 308 is annealed through a rapid thermal annealing (RTA) process at a temperature in a range of 100-1000 degree Celsius for a time period in a range of 1-600 second.

Figure 5D:
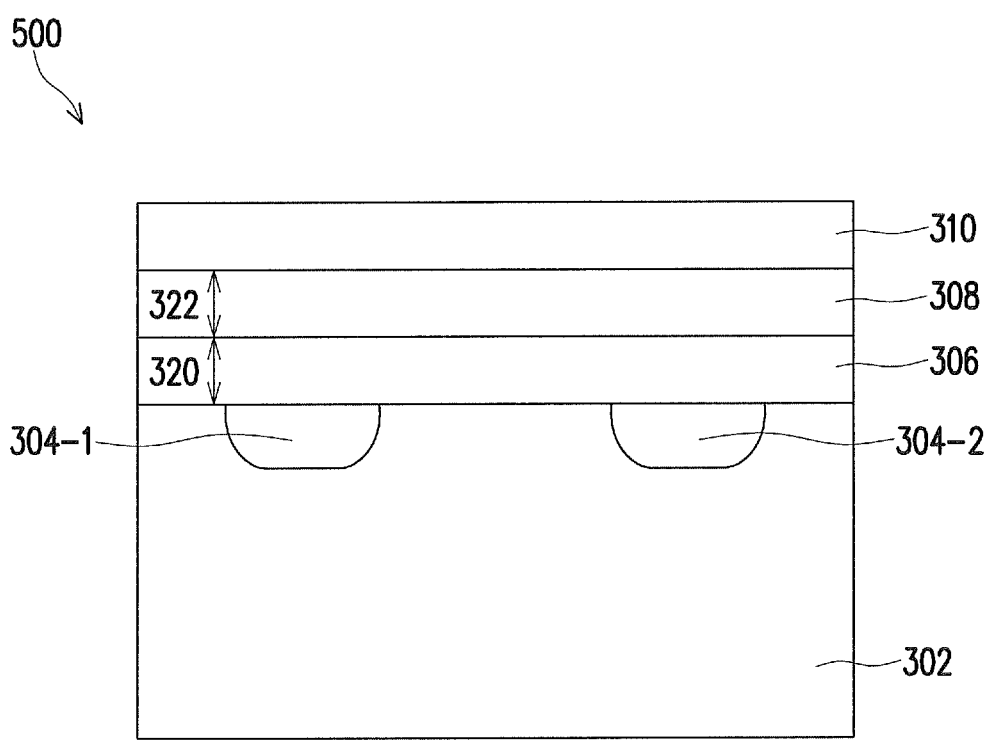

FIG. 5D is a cross-sectional view of the semiconductor device 500 in which a first conductive layer 310 is deposited over the surface of the second dielectric layer 308 at one of the various stages of fabrication that corresponds to operations 408 of FIG. 4, in accordance with some embodiments of the present disclosure. In some embodiments, the first conductive layer 310 comprises polycrystalline silicon (polySi). In some embodiments, the first conductive layer has a thickness in a range of 0.1-100,000 nanometers.

Figure 5E:
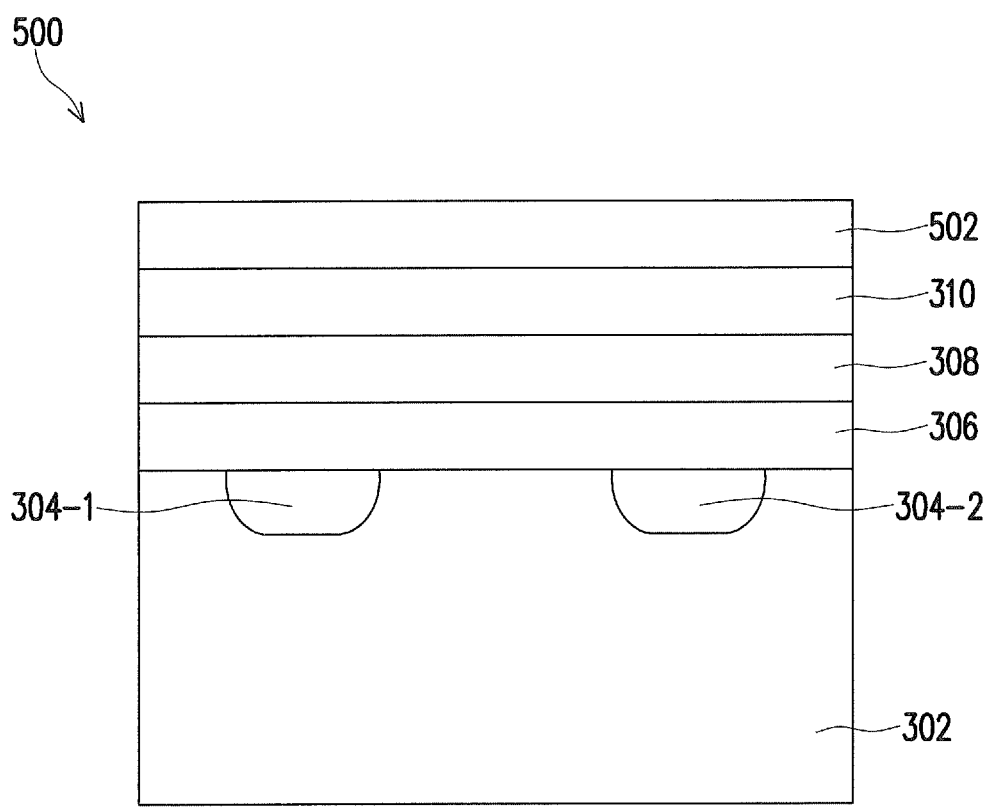

FIG. 5E is a cross-sectional view of the semiconductor device 500 in which a photoresist layer 502 is coated on the surface of the first conductive layer 310 at one of the various stages of fabrication that corresponds to operation 410 of FIG. 4, in accordance with some embodiments of the present disclosure. As described below, the patterned photoresist layer 502 is used to mask an etching of the first conductive layer 310, the second dielectric layer 308, and the first dielectric layer 306 to form a stacked-dielectric gate terminal on the substrate 302. In some embodiments, the stacked-dielectric gate terminal is configured between the conductive features 304-1/304-2 in the substrate 302, forming a MOSFET structure.

In some embodiments, an initial photoresist layer 502 before the patterning process may include a negative or positive tone photoresist layer that is patternable in response to a photolithography light source. In some alternative embodiments, the initial photoresist layer 502 may include an e-beam (electron beam) resist layer (e.g., poly methyl methacrylate, methyl methacrylate, etc.) that is patternable in response to an e-beam lithography energy source. In some embodiments, the initial photoresist layer 502 is formed over the second dielectric layer 308 using a deposition process known in the art such as spin-coating, spray-coating, dip-coating, roller-coating, or the like.

Figure 5F:
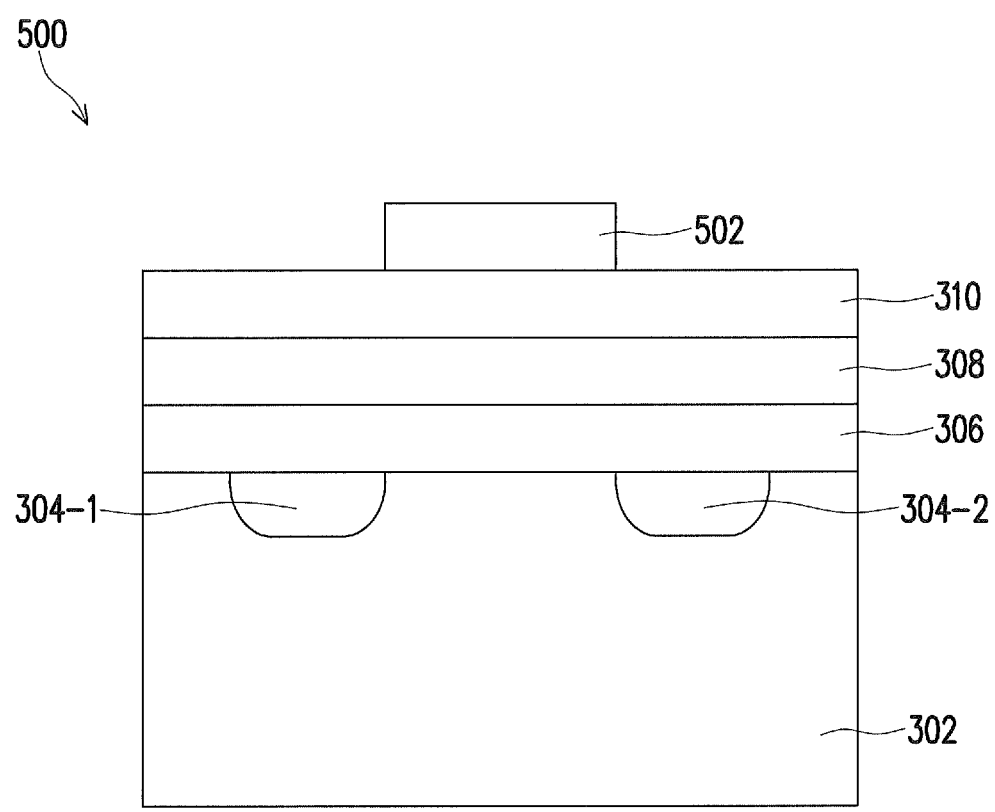

FIG. 5F is a cross-sectional view of the semiconductor device 500 in which a photoresist layer 502 is patterned on the surface of the first conductive layer 310 at one of the various stages of fabrication that corresponds to operation 410 of FIG. 4, in accordance with some embodiments of the present disclosure. Accordingly, in some embodiments, the patterned photoresist layer 502 is formed after a conventional patterning (e.g., photolithography) process, to align the stacked-dielectric gate terminal to the conductive features 304-1/304-2 in the substrate 302. The initial photoresist layer 502 is patterned in a lithography process that may involve various exposure, developing, baking, stripping, etching, and rinsing processes. As a result, the patterned photoresist layer 502 is formed such that at least a portion of the top surface of the first conductive layer 310 is exposed, as shown in FIG. 5F.

Figure 5G:
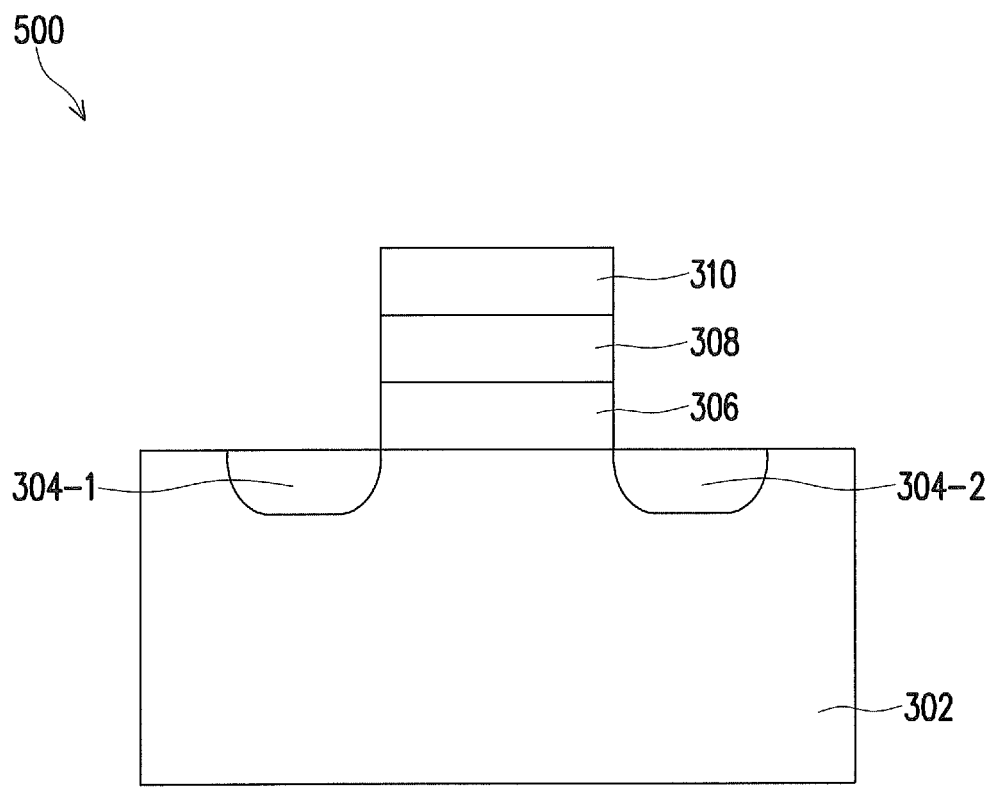

FIG. 5G is a cross-sectional view of the semiconductor device 500 in which the first conductive layer 310, the second dielectric layer 308 and the first dielectric layer 306 are patterned at one of the various stages of fabrication that corresponds to operation 410 of FIG. 4, in accordance with some embodiments of the present disclosure. In some embodiments, the pattered photoresist layer 502 is used as a hard mask during the patterning process. In some embodiments, the first conductive layer 310, the second dielectric layer 308, and the first dielectric layer 306 are etched by a dry and/or wet etching process.

In some embodiments, the patterned photoresist layer 502 is further removed. In some embodiments, the patterned photoresist layer 502 may be removed by one or more chemical cleaning processes using acetone, 1-Methyl-2-pyrrolidon (NMP), Dimethyl sulfoxide (DMSO), or other suitable removing chemicals. In some embodiments, the chemicals used may need to be heated to temperatures higher than room temperature to effectively dissolve the patterned photoresist layer 502. The selection of the remover is determined by the type and chemical structure of the patterned photoresist layer 502, the first conductive layer 310, the second dielectric layer 308, the first dielectric layer 306, as well as the substrate 302 to assure the chemical compatibility of these layers with the chemical cleaning process. In some embodiments, this cleaning process is then followed by a rinsing process using isopropyl alcohol or the like, followed by rinsing using deionized water. As a result of this process, the stacked-dielectric gate terminal is formed on the substrate 302.

Figure 5H:
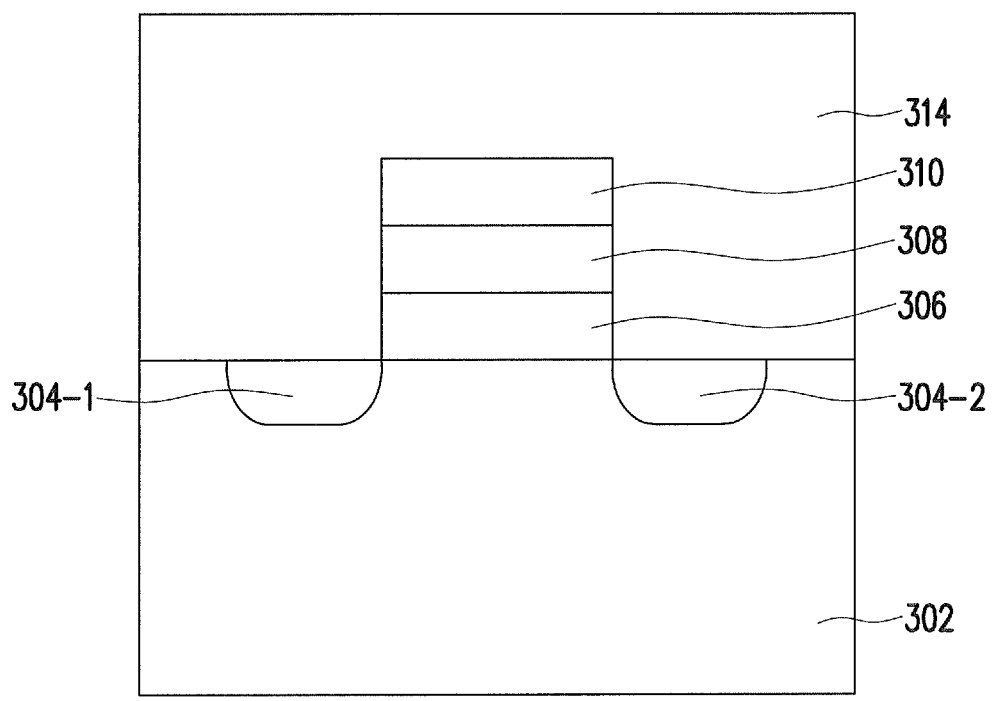

FIG. 5H is a cross-sectional view of the semiconductor device 500 in which a third dielectric layer 314 is formed to cover exposed portions of the substrate 302 and embed the stacked-dielectric gate terminal at one of the various stages of fabrication that corresponds to operation 412 of FIG. 4, in accordance with some embodiments of the present disclosure. In some embodiments, the third dielectric layer 314 comprises silicon oxide. In some embodiments, the third dielectric layer 314 is further polished to achieve a planar surface.

Figure 5I:
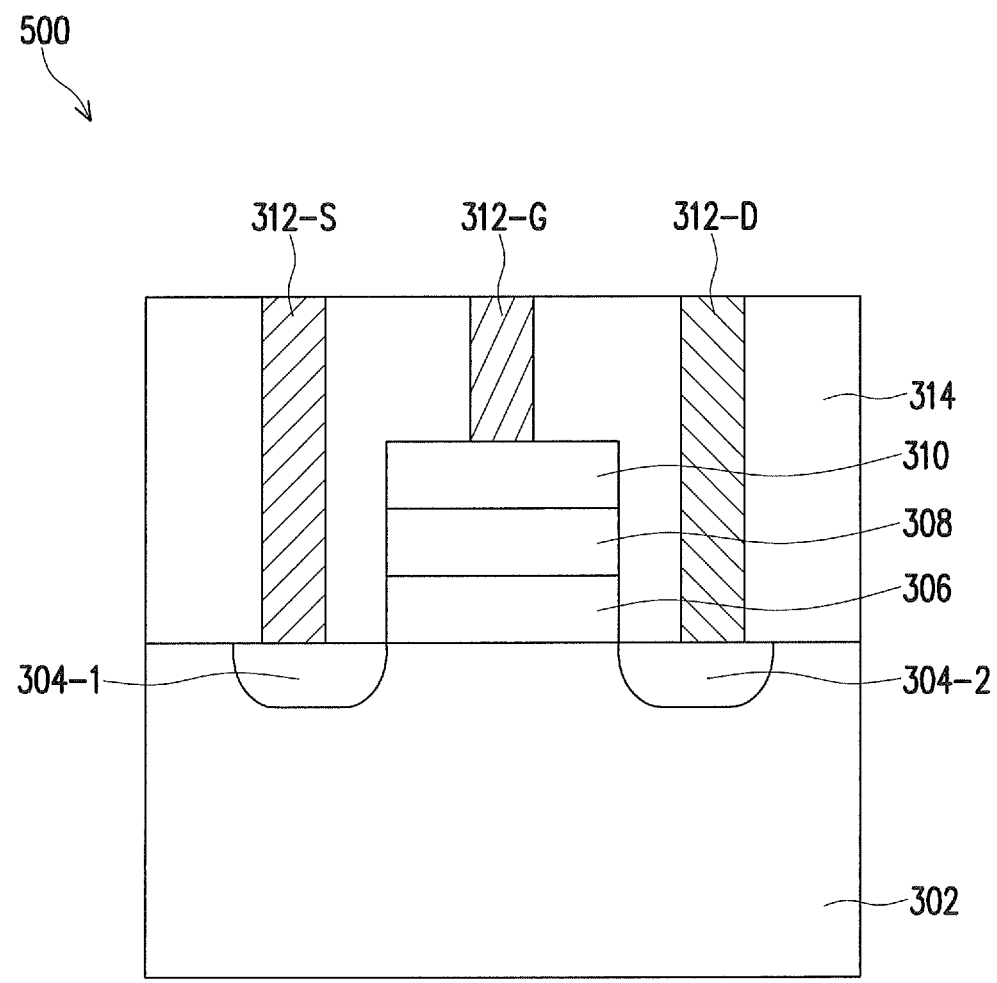

FIG. 5I is a cross-sectional view of the semiconductor device 500 in which metal contacts are formed in the third dielectric layer 314 at one of the various stages of fabrication that corresponds to operation 414 of FIG. 4, in accordance with some embodiments of the present disclosure. In some embodiments, at least three metal contacts 312-G are formed to make electrical contact to the first conductive layer 310, as discussed in FIG. 3B. In some embodiments, metal contacts 312-S and 312-D are also formed simultaneously making electrical contacts to the conductive features 304-1 and 304-2, respectively. An exemplary top view of the semiconductor device 500 after operation 414 is illustrated and discussed in FIG. 3B.

Figure 6A:
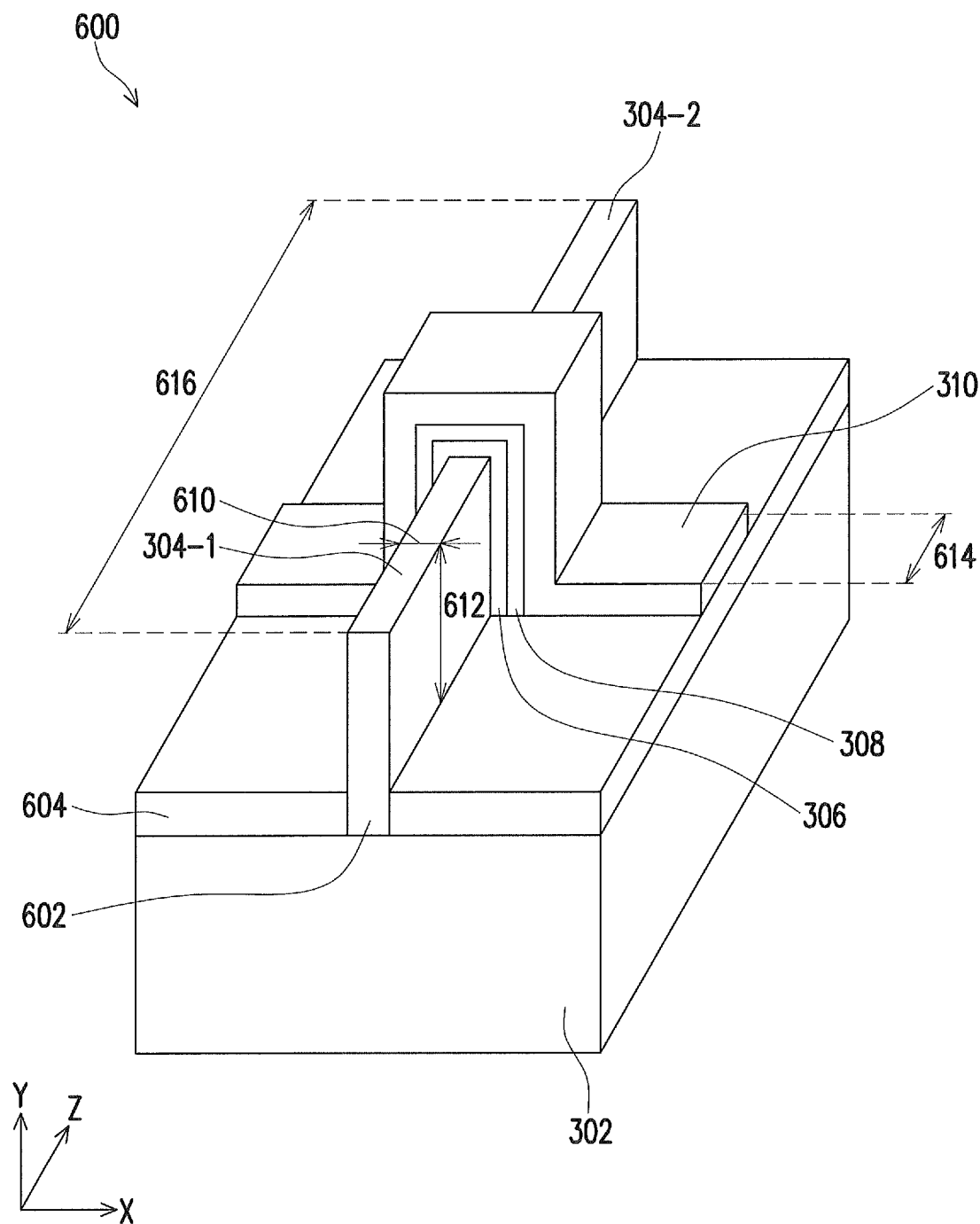
FIGS. 6A-6C illustrate an exemplary perspective view, a cross-sectional view and a top view of an Radio Frequency (RF) switch based on a negative-capacitance Fin field effect transistor (FinFET), in accordance with some embodiments of the present disclosure.
Figure 6B:
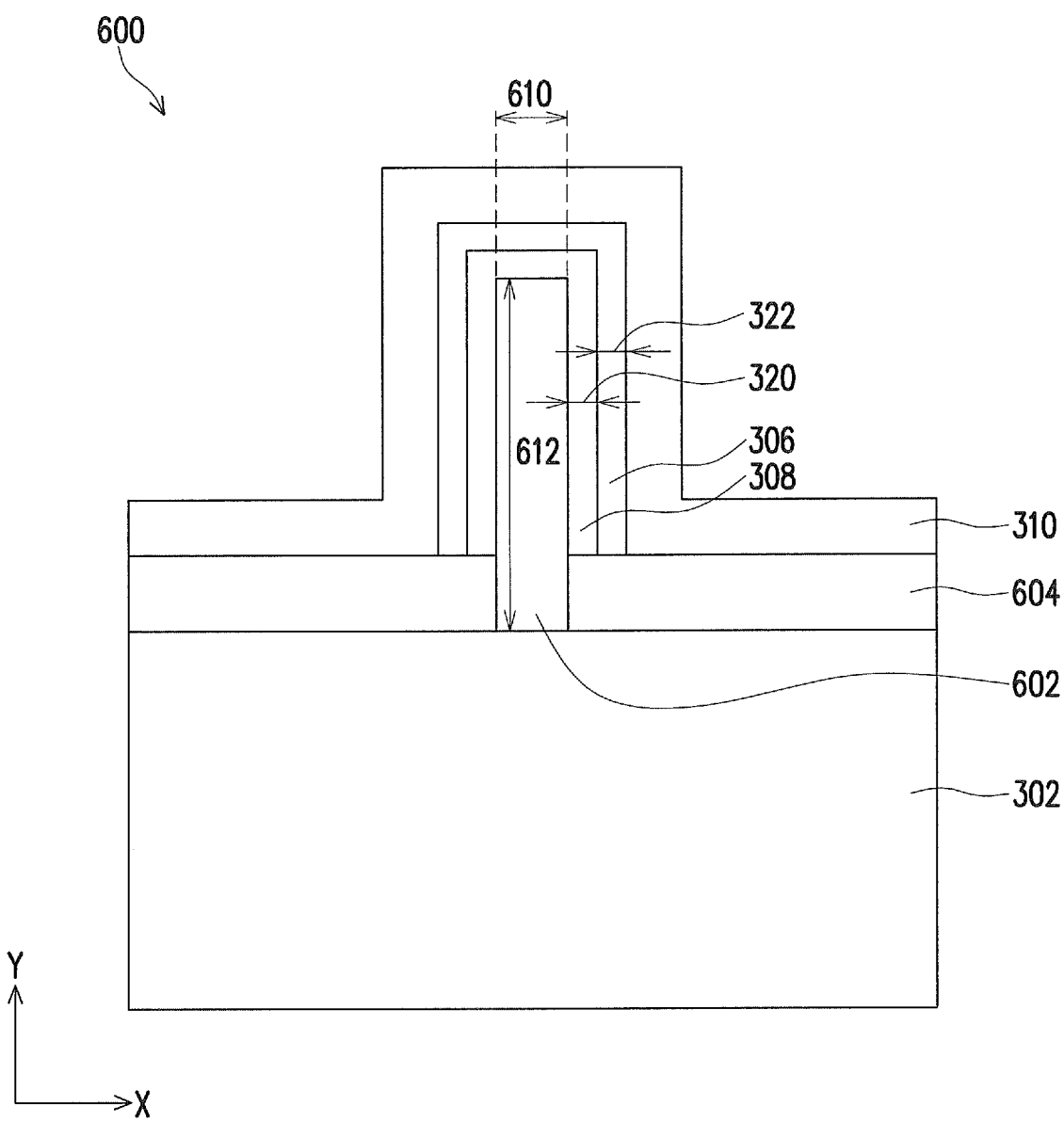
Figure 6C:
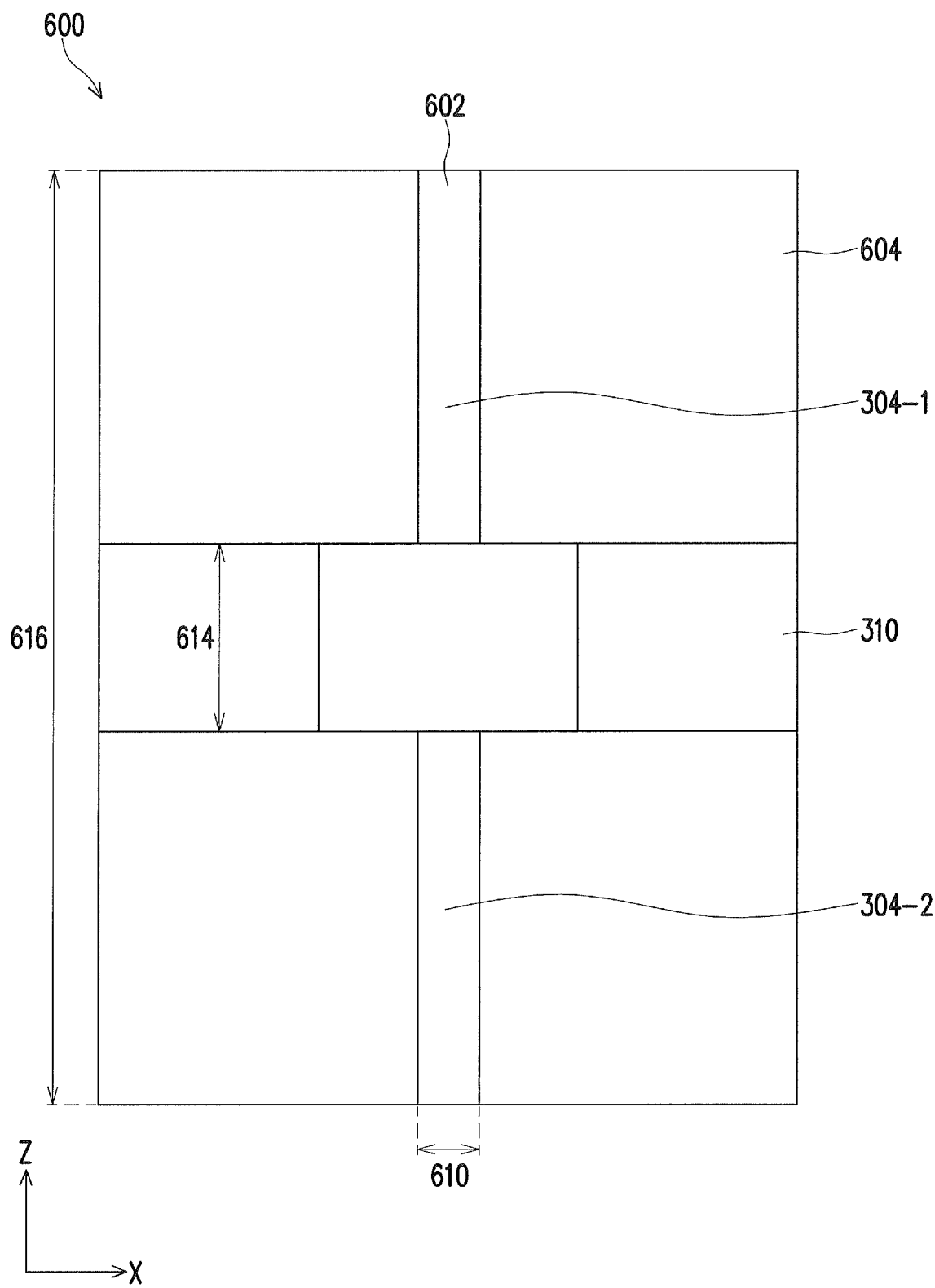

FIGS. 6A-6C illustrate exemplary perspective view, cross-sectional view, and top view of a semiconductor device 600, in accordance with some embodiments of the present disclosure. The negative-capacitance FET structure in this present disclosure can be also implemented in a non-planar Fin field effect transistor (FinFET). The FinFET are fabricated with a thin vertical "fin" of "fin structure" 602 extending from a substrate 302 with a channel formed in this vertical fin and a conductive gate 310 over the fin 602. Advantages of the FinFET includes reducing the short channel effect and higher current flow.

In the illustrated embodiment, conductive features 304-1 and 304-2 are fabricated in the fin 602 separated by a channel length 614. The conductive gate 310 is deposited over the fin 602 covering the top surface and the sidewalls of the fin 602. Specifically, the gate terminal 310 is also partially on the surface of the substrate 302 separated by a dielectric layer 604; and the gate terminal 310 is separated from the fin 602 by stacked gate dielectrics. In some embodiments, the top surface of the fin 602 to the top surface of the dielectric layer 604 has a height 612 and the fin 602 has a fin width 610, resulting in a channel width which equals the fin width 610+2× fin height 610.

In the illustrated embodiment, the stacked gate dielectrics separating the fin 602 and the conductive gate 310 is inhomogeneous comprising 2 stacked dielectric materials, i.e., a first dielectric layer 306 and a second dielectric layer 308. The inhomogeneous capacitor with two dielectrics between the gate terminal and the source terminal can be modelled as two capacitors in series, i.e., a first capacitor C1 316 in the first dielectric layer 306 and a second capacitor C2 318 in the second dielectric layer 308. The overall capacitance Ceq is determined by the equation below $$Ceq = (C1^{-1} + C2^{-1})^{-1} = C1C2/(C1+C2).$$

When C2=−1.1C1, Ceq=11C1. Therefore, a negative-capacitance material in the second dielectric layer 308 significantly increases the equivalent capacitance and thus in order to obtain the same capacitance, such device structure presented in this present disclosure occupies a smaller area than the device with just a high-k dielectric layer.

In some embodiments, the first dielectric layer 306 comprises a conventional dielectric material with high dielectric constant (i.e., a high-k dielectric material) for improved reliability and high capacitance values. In some embodiments, the first dielectric layer 306 comprises one of the following materials, including hafnium silicate (HfSiO4), zirconium silicate (ZrSiO4), hafnium dioxide (HfO2), zirconium dioxide (ZrO2), silicon oxynitride (Si2ON2), and nitride hafnium silicates (HfSiON).

In some embodiments, a first thickness 320 of the first dielectric layer 306 is in a range of 0.1-200 nanometers. In some embodiments, the first dielectric layer 306 is deposited using plasma enhanced chemical vapor deposition (PECVD) with a silane gas as a precursor gas. In some other embodiments, the first dielectric layer 306 is deposited using one of the following: an atomic layer deposition (ALD) process, and a physical vapor deposition (PVD) process.

In some embodiments, the second dielectric layer 308 is formed on the top surface of the first dielectric layer 306, wherein the second dielectric layer 308 exhibit a negative capacitance (i.e., C2<0) in a certain range of an applied bias. In some embodiments, the second dielectric layer 308 comprises HfO2 doped with various elements including Y, Sr, Gd, Zr, Al, Lu, Ta, Nb, and Si, wherein the doped HfO2 dielectric in the second dielectric layer 308 exhibits ferroelectric properties. In some embodiments, the doped HfO2 dielectric in the second dielectric layer 308 is ascribed to the metastable, non-centrosymmetric, orthorhombic phase being stabilized by the dopants. In some embodiments, the doped HfO2 dielectric in the second dielectric layer 308 can be easily integrated with the CMOS process. In some other embodiments, the second dielectric layer 308 further comprises ZrO2 doped with Ta and Ti. In some further embodiments, the second dielectric layer 308 comprises a ferroelectric material, including BaTiO3, SrRuO3, and PbZr1-xTixO3.

In some embodiments, a second thickness 322 of the second dielectric layer 308 is in a range of 0.1-200 nanometers. In the illustrated embodiments, the first dielectric layer 306 and the second dielectric layer 308 each has a length of 614 in the z direction and a width which equals the channel width. In some embodiments, the second dielectric layer 308 is deposited using plasma enhanced chemical vapor deposition (PECVD) with a silane gas as a precursor gas. In some other embodiments, the second dielectric layer 308 is deposited using one of the following: an atomic layer deposition (ALD) process, and a physical vapor deposition (PVD) process. In some embodiments, the second dielectric layer 308 is deposited at a temperature in a range of 0-1000 degree Celsius. In some embodiments, after deposition of the second dielectric layer 308 and before forming the conductive gate 310, the second dielectric layer 308 is annealed through a rapid thermal annealing (RTA) process at a temperature in a range of 100-1000 degree Celsius for a time period in a range of 1-600 second.

Although in the exemplary embodiment, the second dielectric layer 308 is configured above the first dielectric layer 306, wherein the first dielectric layer 306 is in direct contact with the fin 602, the second dielectric layer 308 can be configured between the first dielectric layer 306 and the fin 602, which is also within the scope of this invention. Although only 2 dielectric layers in the stacked gate dielectrics are shown, the exemplary embodiment is for discussion purposes. It should be noted that the stacked gate dielectrics can comprise any numbers of alternating dielectric layers, e.g., negative-capacitance dielectric layer—conventional dielectric layer superlattices, which are within the scope of the invention.

In some embodiments, the substrate 302 is a silicon substrate. Alternatively, the substrate 302 may include other elementary semiconductor material such as, for example, germanium. The substrate 302 may also include a compound semiconductor such as silicon carbide, gallium arsenic, indium arsenide, and indium phosphide. The substrate 302 may include an alloy semiconductor such as silicon germanium, silicon germanium carbide, gallium arsenic phosphide, and gallium indium phosphide. In one embodiment, the substrate 302 includes an epitaxial layer. For example, the substrate 302 may have an epitaxial layer overlying a bulk semiconductor. Furthermore, the substrate 302 may include a semiconductor-on-insulator (SOI) structure. For example, the substrate 302 may include a buried oxide (BOX) layer formed by a process such as separation by implanted oxygen (SIMOX) or other suitable technique, such as wafer bonding and grinding.

In some embodiments, the substrate 302 also includes various p-type doped regions and/or n-type doped regions, implemented by a process such as ion implantation and/or diffusion. Those doped regions include n-well, p-well, lightly doped region (LDD), heavily doped source and drain (S/D) terminals, and various channel doping profiles configured to form various integrated circuit (IC) devices. The substrate 302 may further include other functional features such as a resistor or a capacitor formed in and on the substrate. The substrate 302 further includes lateral isolation features provided to separate various devices formed in the substrate 302, for example shallow trench isolation (STI).

In some embodiments, the fin 602 is fabricated in the substrate 302. In some embodiment, at least one conductive feature is included in the fin 602. In some embodiments, the at least one conductive feature can be the source terminal 304-1, the drain terminal 304-2, or the conductive gate 310. Alternatively, the at least one conductive feature may be a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or on source/drain (typically known as "salicide") by a self-aligned silicide technique. In another embodiment, the at least one conductive feature may include an electrode of a capacitor or one end of a resistor.

In the illustrated embodiment, at least three metal contacts 312-G are configured to make electrical contact to the conductive gate 310. In some embodiments, each of the at least three metal contacts has a width 324 and an enclosure distance 326, wherein the enclosure distance 326 is defined as a distance between the edge of the metal contacts 312-G to the edge of the conductive gate 310. The at least three metal contacts 312-G are configured in a row with a spacing 330 between two of the neighboring metal contacts. In some embodiments, a first ratio between the spacing 330 and the first thickness 320 of the first dielectric layer 306 is in a range of 0.01-100; a second ratio between the spacing 330 and the second thickness 322 of the second dielectric layer 308 is in a range of 0.1-10000; a third ratio between the spacing 330 and the channel width 334 is in a range of 0.1-10000; a fourth ratio between the spacing 330 and the channel length 332 is in a range of 0.00001-1; a fifth ratio of the enclosure distance 326 and the second thickness 322 of the second dielectric layer 308 is in a range of 0.1-10000; a sixth ratio of the enclosure distance 326 and the channel width 334 is in a range of 0.1-10000; and a seventh ratio of the enclosure distance 326 and the channel length 332 is in a range of 0.1-10000.

Figure 7:
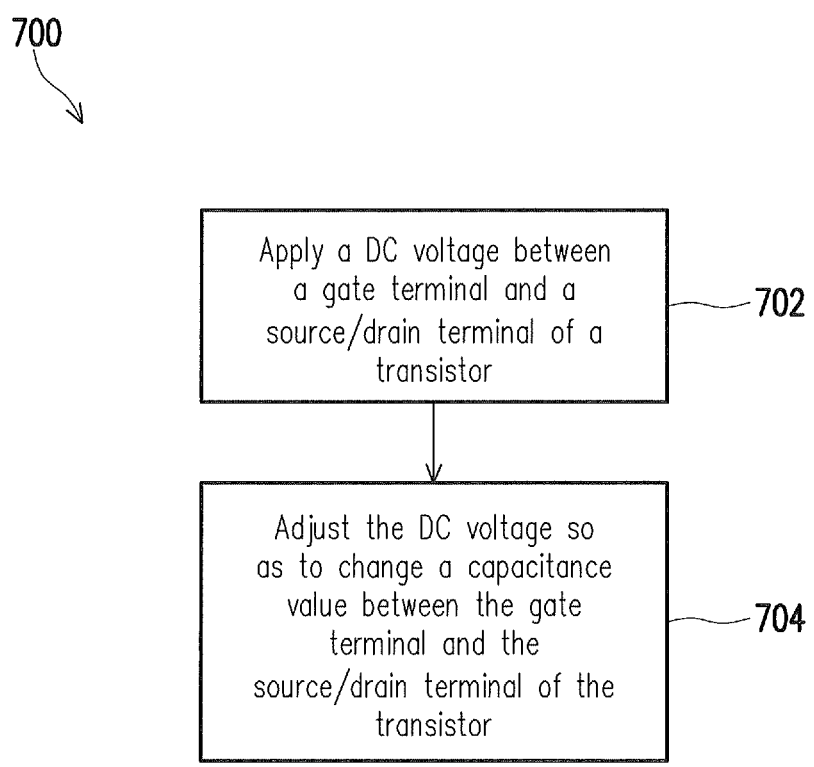
FIG. 7 illustrates a flow chart of a method to operate a Radio Frequency (RF) switch module, in accordance with some embodiments of the present disclosure.

FIG. 7 illustrates a flow chart of a method 700 operate a Radio Frequency (RF) switch module 200, in accordance with some embodiments of the present disclosure. It is noted that the method 700 is merely an example, and is not intended to limit the present disclosure. Accordingly, it is understood that additional operations may be provided before, during, and after the method 700 of FIG. 7, and that some other operations may only be briefly described herein.

The method 700 starts with operation 702, in which a DC voltage is applied between a gate terminal and a drain terminal of a field effect transistor (FET), according to some embodiments. In some embodiments, the FET comprises stacked gate dielectrics. In the illustrated embodiment, the stacked gate dielectrics is inhomogeneous in the y direction comprising 2 stacked dielectric materials, i.e., a first dielectric layer 306 and a second dielectric layer 308. The inhomogeneous capacitor with two dielectrics between the gate terminal and the source terminal can be modelled as two capacitors in series, i.e., a first capacitor C1 316 in the first dielectric layer 306 and a second capacitor C2 318 in the second dielectric layer 308. The overall capacitance Ceq is determined by the following equation: $Ceq=(C1^{-1}+C2^{-1})^{-1}=C1C2/(C1+C2)$.

When $C2=-1.1C1$, $Ceq=11C1$. Therefore, a negative-capacitance material in the second dielectric layer 308 significantly increases the equivalent capacitance and thus in order to obtain the same capacitance, such device structure presented in this present disclosure occupies a smaller area than the device with just a high-k dielectric layer.

In some embodiments, the first dielectric layer 306 comprises a conventional dielectric material with high dielectric constant (i.e., a high-k dielectric material) for improved reliability and high capacitance values. In some embodiments, the first dielectric layer 306 comprises one of the following materials, including hafnium silicate (HfSiO4), zirconium silicate (ZrSiO4), hafnium dioxide (HfO2), zirconium dioxide (ZrO2), silicon oxynitride (Si2ON2), and nitride hafnium silicates (HfSiON).

In some embodiments, a first thickness 320 of the first dielectric layer 306 is in a range of 0.1-200 nanometers. In some embodiments, the first dielectric layer 306 is deposited using plasma enhanced chemical vapor deposition (PECVD) with a silane gas as a precursor gas. In some other embodiments, the first dielectric layer 306 is deposited using one of the following: an atomic layer deposition (ALD) process, and a physical vapor deposition (PVD) process.

In some embodiments, the second dielectric layer 308 is formed on the top surface of the first dielectric layer 306, wherein the second dielectric layer 308 exhibit a negative capacitance (i.e., C2<0) in a certain range of an applied bias. In some embodiments, the second dielectric layer 308 comprises HfO2 doped with various elements including Y, Sr, Gd, Zr, Al, Lu, Ta, Nb, and Si, wherein the doped HfO2 dielectric in the second dielectric layer 308 exhibits ferro-electric properties. In some embodiments, the doped HfO2 dielectric in the second dielectric layer 308 is ascribed to the metastable, non-centrosymmetric, orthorhombic phase being stabilized by the dopants. In some embodiments, the doped HfO2 dielectric in the second dielectric layer 308 can be easily integrated with the CMOS process. In some other embodiments, the second dielectric layer 308 further comprises ZrO2 doped with Ta and Ti. In some further embodiments, the second dielectric layer 308 comprises a ferro-electric material, including BaTiO3, SrRuO3, and PbZr1-xTixO3.

In some embodiments, a second thickness 322 of the second dielectric layer 308 is in a range of 0.1-200 nanometers. In the illustrated embodiments, the second dielectric layer 308 has a length of 332 in the z direction and a width of 334 in the x direction, which has the same area as the conductive gate 310. In some embodiments, a ratio between the area of a top surface of the second dielectric layer 308 and the transistor channel is in a range of 0.1-5. In some embodiments, the second dielectric layer 308 is deposited using plasma enhanced chemical vapor deposition (PECVD) with a silane gas as a precursor gas. In some other embodiments, the second dielectric layer 308 is deposited using one of the following: an atomic layer deposition (ALD) process, and a physical vapor deposition (PVD) process. In some embodiments, the second dielectric layer 308 is deposited at a temperature in a range of 0-1000 degree Celsius. In some embodiments, after deposition of the second dielectric layer 308 and before forming the conductive gate 310, the second dielectric layer 308 is annealed through a rapid thermal annealing (RTA) process at a temperature in a range of 100-1000 degree Celsius for a time period in a range of 1-600 second.

Although in the exemplary embodiment, the second dielectric layer 308 is configured above the first dielectric layer 306, wherein the first dielectric layer 306 is in direct contact with the substrate 302, the second dielectric layer 308 can be configured between the first dielectric layer 306 and the substrate 302, which is also within the scope of this invention. Although only 2 dielectric layers in the stacked gate dielectrics are shown, the exemplary embodiment is for discussion purposes. It should be noted that the stacked gate dielectrics can comprise any numbers of alternating dielectric layers, e.g., negative-capacitance dielectric layer—conventional dielectric layer superlattices, which are within the scope of the invention.

In some embodiments, the substrate 302 is a silicon substrate. Alternatively, the substrate 302 may include other elementary semiconductor material such as, for example, germanium. The substrate 302 may also include a compound semiconductor such as silicon carbide, gallium arsenic, indium arsenide, and indium phosphide. The substrate 302 may include an alloy semiconductor such as silicon germanium, silicon germanium carbide, gallium arsenic phosphide, and gallium indium phosphide. In one embodiment, the substrate 302 includes an epitaxial layer. For example, the substrate 302 may have an epitaxial layer overlying a bulk semiconductor. Furthermore, the substrate 302 may include a semiconductor-on-insulator (SOI) structure. For example, the substrate 302 may include a buried oxide (BOX) layer formed by a process such as separation by implanted oxygen (SIMOX) or other suitable technique, such as wafer bonding and grinding.

In some embodiments, the substrate 302 also includes various p-type doped regions and/or n-type doped regions, implemented by a process such as ion implantation and/or diffusion. Those doped regions include n-well, p-well, lightly doped region (LDD), heavily doped source and drain (S/D) terminals 304-1/304-2, and various channel doping profiles configured to form various integrated circuit (IC) devices, such as a CMOS field-effect transistor (CMOSFET), imaging sensor, and/or light emitting diode (LED). The substrate 302 may further include other functional features such as a resistor or a capacitor formed in and on the substrate. The substrate 302 further includes lateral isolation features provided to separate various devices formed in the substrate 302, for example shallow trench isolation (STI). The various devices in the substrate 302 further include silicide disposed on S/D terminals, gate terminal and other device features for reduced contact resistance and enhance process compatibility when coupled between devices through metal contacts 312-S/312-D/312-G. In some embodiments, the distance between the source and the drain terminal is the channel length 328.

In some embodiment, at least one conductive feature is included in the substrate 302. In some embodiments, the at least one conductive feature can be a source 304-1, drain 304-2, or gate terminals 310. Alternatively, the at least one conductive feature may be a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or on source/drain (typically known as "salicide") by a self-aligned silicide technique. In another embodiment, the at least one conductive feature may include an electrode of a capacitor or one end of a resistor.

In the illustrated embodiment, at least three metal contacts 312-G are configured to make electrical contact to the conductive gate 310. In some embodiments, each of the at least three metal contacts has a width 324 and an enclosure distance 326, wherein the enclosure distance 326 is defined as a distance between the edge of the metal contacts 312-G to the edge of the conductive gate 310. The at least three metal contacts 312-G are configured in a row with a spacing 330 between two of the neighboring metal contacts. In some embodiments, a first ratio between the spacing 330 and the first thickness 320 of the first dielectric layer 306 is in a range of 0.01-100; a second ratio between the spacing 330 and the second thickness 322 of the second dielectric layer 308 is in a range of 0.1-10000; a third ratio between the spacing 330 and the channel width 334 is in a range of 0.1-10000; a fourth ratio between the spacing 330 and the channel length 332 is in a range of 0.00001-1; a fifth ratio of the enclosure distance 326 and the second thickness 322 of the second dielectric layer 308 is in a range of 0.1-10000; a sixth ratio of the enclosure distance 326 and the channel width 334 is in a range of 0.1-10000; and a seventh ratio of the enclosure distance 326 and the channel length 332 is in a range of 0.1-10000.

The method 700 continues with operation 704, in which the DC voltage is adjusted so as to tune the equivalent capacitance (Ceq) according to some embodiments. In one embodiment, a Radio Frequency (RF) switch module, includes, a switch circuit for switching between transmitting first signals from a transmitter unit to an antenna and transmitting second signals from the antenna to the receiver unit, wherein the switch circuit comprises a plurality of field effect transistors (FETs), wherein each of the plurality of FETs comprises stacked gate dielectrics and at least three metal contacts to a conductive gate, wherein the stacked gate dielectrics comprises at least one first dielectric layer, wherein the first dielectric layer comprises a negative-capacitance material.

In another embodiment, a semiconductor device, includes, a field effect transistor (FET), wherein the FET comprises stacked gate dielectrics and at least three metal contacts to a conductive gate, wherein the stacked gate dielectrics comprises at least one first dielectric layer, wherein the first dielectric layer comprises a negative-capacitance material.

In another embodiment, a method for operating a semiconductor device for alternately sending and receiving with an antenna, includes, transmitting first Radio Frequency (RF) signals from a transmitter unit to an antenna through a transmitter transmission line; and receiving second RF signals from the antenna to a receiver unit through a receiver transmission line, wherein each of the transmitting and receiving further includes, adjusting DC voltages on corresponding gate terminals of a plurality of field effect transistors (FETs) in an Radio Frequency (RF) switch; grounding corresponding body terminals of the plurality of FETs to ground; maintaining corresponding source terminals open; and coupling corresponding drain terminals to ground.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A Radio Frequency (RF) switch module, comprising:
a switch circuit for switching between transmitting first signals from a transmitter port to an antenna port and transmitting second signals from the antenna port to a receiver port, wherein the switch circuit comprises;
a first capacitance switch that couples the antenna port to the transmitter port;

a second capacitance switch that couples the antenna port to the receiver port;

a first power supply unit coupled between the antenna port and ground;

a second power supply unit coupled between the transmitter port and ground; and a third power supply unit coupled between the receiver port and ground, wherein each of the two capacitance switches comprises stacked gate dielectrics and at least three metal contacts coupled to a conductive gate, wherein the stacked gate dielectrics comprises at least one first dielectric layer and at least one second dielectric layer, and wherein the at least one second dielectric layer comprises a different material than the at least one first dielectric layer.

2. The RF switch of claim 1, wherein the at least one first dielectric layer comprises a negative-capacitance material and the at least one second dielectric layer comprises a high dielectric constant (high-k) dielectric material.

3. The RF switch of claim 2, wherein a first thickness of the at least one first dielectric layer is in a range of 0.1-200 nanometers.

4. The RF switch of claim 2, wherein the negative-capacitance material in the first dielectric layer comprises one of the following: doped Hafnium dioxide (HfO2) and doped Zirconium oxide (ZrO2), wherein each of the doped HfO2 and the doped ZrO2 is doped with at least one of the following elements: Yttrium (Y), Strontium (Sr), Gadolinium (Gd), Zirconium (Zr), Aluminum (Al), Tantalum (Ta), Niobium (Nb), and Silicon (Si).

5. The RF switch of claim 2, wherein the at least three metal contacts coupled to the conductive gate are configured linearly providing electrical contacts to the conductive gate, wherein the at least three metal contacts are configured with a first width, a spacing between two adjacent metal contacts, and an enclosure distance, wherein the enclosure distance is defined as the shortest distance from an edge of the metal contact to an edge of the conductive gate.

6. The RF switch of claim 5, wherein a first ratio between the spacing and a first thickness of the first dielectric layer is in a range of 0.1-10000; a second ratio between the spacing and a channel length is in a range of 0.1-10000; a third ratio between the spacing and a channel width is in a range of 0.1-10000; a fourth ratio between the enclosure distance and the first thickness of the first dielectric layer is in a range of 0.1-10000; a fifth ratio between the enclosure distance and the channel width is in a range of 0.1-10000; and a sixth ratio between the enclosure distance and the channel length is in a range of 0.1-10000.

7. The RF switch of claim 1, wherein the first power supply unit, the second power supply unit and the third power supply unit are respectively coupled to at least three metal contacts.

8. A switch, comprising:
a first a field effect transistor (FET) coupled between an antenna port and a transmitter port;
a second FET coupled between the antenna port and a receiver port;
a first power supply unit coupled to the antenna port;
a second power supply unit coupled to the transmitter port; and
a third power supply coupled to the receiver port,
wherein the first FET and the second FET each comprises stacked gate dielectrics and at least three metal contacts coupled to a conductive gate, wherein the stacked gate dielectrics comprises at least one first dielectric layer and at least one second dielectric layer, and wherein the at least one second dielectric layer comprises a different material than the at least one first dielectric layer.

9. The switch of claim 8, wherein the at least one first dielectric layer comprises a negative-capacitance material and the at least one second dielectric layer comprises a high dielectric constant (high-k) dielectric material.

10. The switch of claim 9, wherein the at least one second dielectric layer comprises Hafnium dioxide (HfO2).

11. The switch of claim 9, wherein a first thickness of the at least one first dielectric layer is in a range of 0.1-200 nanometers.

12. The switch of claim 9, wherein the negative-capacitance material in the at least one first dielectric layer comprises one of the following: doped Hafnium dioxide (HfO2) and doped Zirconium oxide (ZrO2), wherein each of the doped HfO2 and the doped ZrO2 is doped with at least one of the following elements: Yttrium (Y), Strontium (Sr), Gadolinium (Gd), Zirconium (Zr), Aluminum (Al), Tantalum (Ta), Niobium (Nb), and Silicon (Si).

13. The switch of claim 9, wherein the at least three metal contacts coupled to the conductive gate are configured linearly providing electrical contacts to the conductive gate, wherein the at least three metal contacts are configured with a first width, a spacing between two adjacent metal contacts, and an enclosure distance, wherein the enclosure distance is defined as the shortest distance from an edge of the metal contact to an edge of the conductive gate.

14. The switch of claim 13, wherein a first ratio between the spacing and a first thickness of the at least one first dielectric layer is in a range of 0.1-10000; a second ratio between the spacing and a channel length is in a range of 0.1-10000; a third ratio between the spacing and a channel width is in a range of 0.1-10000; a fourth ratio between the enclosure distance and the first thickness of the first dielectric layer is in a range of 0.1-10000; a fifth ratio between the enclosure distance and the channel width is in a range of 0.1-10000; and a sixth ratio between the enclosure distance and the channel length is in a range of 0.1-10000.

15. The switch of claim 8, wherein each of the first and second FETs comprises a fin structure.

16. A switch, comprising:
a switch circuit for switching between transmitting first signals from a transmitter port to an antenna port and transmitting second signals from the antenna port to a receiver port, wherein the switch circuit comprises:
a first capacitance switch implemented with a field effect transistor (FET) that couples the antenna port to the transmitter port;
a second capacitance switch implemented with a FET that couples the antenna port to the receiver port;
a first power supply coupled via a first resistor to the antenna port;
a second power supply coupled via a second resistor to the transmitter port; and
a third power supply coupled via a third resistor to the receiver port,
wherein each of the two capacitance switches comprises at least two layers of stacked gate dielectrics and at least three metal contacts coupled to a conductive gate, and wherein each of the two capacitance switches function as varactor diodes that exhibit a voltage dependence capacitance.

17. The switch of claim 16, wherein the stacked gate dielectrics comprises at least one first dielectric layer and at least one second dielectric layer, and wherein the at least one second dielectric layer comprises a different material than the at least one first dielectric layer.

18. The switch of claim 17, wherein the at least one first dielectric layer comprises a negative-capacitance material and the at least one second dielectric layer comprises a high dielectric constant (high-k) dielectric material.

19. The switch of claim 18, wherein the negative-capacitance material in the first dielectric layer comprises one of the following: doped Hafnium dioxide (HfO2) and doped Zirconium oxide (ZrO2), wherein each of the doped HfO2 and the doped ZrO2 is doped with at least one of the following elements: Yttrium (Y), Strontium (Sr), Gadolinium (Gd), Zirconium (Zr), Aluminum (Al), Tantalum (Ta), Niobium (Nb), and Silicon (Si).

20. The switch of claim 17, wherein the at least three metal contacts coupled to the conductive gate are configured linearly providing electrical contacts to the conductive gate, wherein the at least three metal contacts are configured with a first width, a spacing between two adjacent metal contacts, and an enclosure distance, wherein the enclosure distance is defined as the shortest distance from an edge of the metal contact to an edge of the conductive gate.

* * * * *